(12) United States Patent
Hidaka et al.

(10) Patent No.: US 11,816,595 B2
(45) Date of Patent: Nov. 14, 2023

(54) INFORMATION PROCESSING SYSTEM

(71) Applicant: KABUSHIKI KAISHA TOSHIBA, Tokyo (JP)

(72) Inventors: Ryo Hidaka, Akishima Tokyo (JP); Kosuke Tatsumura, Yokohama Kanagawa (JP); Masaya Yamasaki, Komae Tokyo (JP); Yohei Hamakawa, Kawasaki Kanagawa (JP); Hayato Goto, Kawasaki Kanagawa (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 438 days.

(21) Appl. No.: 17/249,293

(22) Filed: Feb. 25, 2021

(65) Prior Publication Data

US 2022/0051120 A1 Feb. 17, 2022

(30) Foreign Application Priority Data

Aug. 13, 2020 (JP) ................................. 2020-136775

(51) Int. Cl.
*G06N 7/08* (2006.01)
*H03K 19/177* (2020.01)

(52) U.S. Cl.
CPC ............. *G06N 7/08* (2013.01); *H03K 19/177* (2013.01)

(58) Field of Classification Search
CPC ................................ G06N 7/08; H03K 19/177
See application file for complete search history.

(56) References Cited

U.S. PATENT DOCUMENTS

2019/0087388 A1* 3/2019 Venturelli ............... G06N 10/00
2019/0266212 A1   8/2019 Goto et al.
(Continued)

FOREIGN PATENT DOCUMENTS

JP        6207584 B2      10/2017
JP     2019-145010 A       8/2019
(Continued)

OTHER PUBLICATIONS

Tanahashi, Kotaro, et al. "Application of Ising machines and a software development for Ising machines." Journal of the Physical Society of Japan 88.6 (2019): 061010. (Year: 2019).*

Hayato Goto, et al., "Combinatorial optimization by simulating adiabatic bifurcations in nonlinear Hamiltonian systems," Science Advances, 5:eaav2372, 8 pages (2019).

H. Goto et al., "Supplementary Materials for Combinatorial optimization by simulating adiabatic bifurcations in nonlinear Hamiltonian systems," Science Advance, vol. 5, No. 4, https://advances.sciencemag.org/content/advances/suppl/2019/04/12/5.4.eaav2372.DC1/aav2372_SM.pdf, 8 pages (Apr. 19, 2019).

(Continued)

*Primary Examiner* — Eric Nilsson
(74) *Attorney, Agent, or Firm* — Finnegan, Henderson, Farabow, Garrett & Dunner, LLP

(57) ABSTRACT

According to an embodiment, an information processing system solves a combinatorial optimization problem. The information processing system includes an Ising machine and a host unit. The Ising machine is hardware configured to perform a search process for searching for the ground state of an Ising model that represents the combinatorial optimization problem. The host unit is hardware connected to the Ising machine via an interface and configured to control the Ising machine. In the search process, for each of a plurality of Ising spins, the Ising machine alternately repeats an auxiliary variable update process for updating an auxiliary variable by a main variable and a main variable update process for updating the main variable by the auxiliary variable multiple times. Prior to the search process, the host unit transmits, to the Ising machine, an initial value of the auxiliary variable corresponding to each of the plurality of Ising spins.

13 Claims, 19 Drawing Sheets

(56) References Cited

U.S. PATENT DOCUMENTS

| | | |
|---|---|---|
| 2019/0278610 A1 | 9/2019 | Tatsumura et al. |
| 2020/0074279 A1* | 3/2020 | Koyama ................ G06N 3/047 |
| 2020/0089473 A1 | 3/2020 | Goto et al. |
| 2020/0089727 A1 | 3/2020 | Kanao et al. |
| 2020/0089731 A1 | 3/2020 | Tatsumura et al. |
| 2020/0090066 A1 | 3/2020 | Kanao et al. |

FOREIGN PATENT DOCUMENTS

| | | |
|---|---|---|
| JP | 2019-159566 A | 9/2019 |
| JP | 2020-46715 A | 3/2020 |
| JP | 2020-46766 A | 3/2020 |
| JP | 2020-46784 A | 3/2020 |
| JP | 2020-46887 A | 3/2020 |

OTHER PUBLICATIONS

T. Miki et al., "Spin Connection Topology and Multi-Bit Spin Interaction Coefficients of Ising Spin Model with Digital Logic Gates," IEEE Int'l Conf. on Design & Test of Integrated Micro & Nano-Systems (DTS), 7 pages (Jun. 7, 2021).

\* cited by examiner

FIG.20

| i, | j, | COUPLING COEFFICIENT |
|---|---|---|
| 1, | 1, | 0.123 |
| 2, | 1, | 0.04 |
| 3, | 1, | 1.3 |
| 4, | 1, | 0.5 |
| 1, | 1, | -0.2 |
| 2, | 1, | ... |
| ... | | |
| 4, | 4, | 1.67 |

INFORMATION PROCESSING SYSTEM

CROSS-REFERENCE TO RELATED APPLICATIONS

This application is based upon and claims the benefit of priority from Japanese Patent Application No. 2020-136775, filed on Aug. 13, 2020; the entire contents of which are incorporated herein by reference.

FIELD

Embodiments described herein relate generally to an information processing system.

BACKGROUND

Optimization of complex systems in various application fields such as finance, logistics, control, and chemistry often results in mathematical combinatorial optimization problems. The combinatorial optimization problem is the problem of finding a combination of discrete values that minimizes a function of discrete variables, the function being called a cost function.

In recent years, a specific purpose device that performs a search process for the ground state of an Ising model has been attracting attention, the specific purpose device being called an Ising machine. The problem of searching for the ground state of the Ising model is called an Ising problem. The Ising problem is a combinatorial optimization problem that minimizes a cost function given by a quadratic function of a variable representing a binary value (Ising spin). The cost function is called Ising energy. Many practical combinatorial optimization problems can be transformed into the Ising problems. Therefore, a system that solves the combinatorial optimization problem can solve a target combinatorial optimization problem by using the Ising machine.

The system that solves the combinatorial optimization problem includes the Ising machine that performs a search process for the ground state of the Ising model and a host unit that performs a process other than a search process. Further, the Ising problem is defined by a coupling coefficient group (J matrix) and an external magnetic field coefficient group (h vector).

In such a system that solves the combinatorial optimization problem, the host unit transmits the J matrix and the h vector to the Ising machine, and receives a value of each of a plurality of optimized Ising spins from the Ising machine. In addition, the Ising machine receives the J matrix and the h vector from the host unit, and returns the value of each of the plurality of Ising spins optimized so as to minimize the Ising energy. It is required for such a system that solves the combinatorial optimization problem to efficiently transmit and receive information between the host unit and the Ising machine, and shorten the time taken from the start of calculation of the combinatorial optimization problem to the output of the solution.

BRIEF DESCRIPTION OF THE DRAWINGS

FIG. 20 is a diagram illustrating coupling information including a coupling coefficient.

DETAILED DESCRIPTION

According to an embodiment, an information processing system solves a combinatorial optimization problem. The information processing system includes an Ising machine and a host unit. The Ising machine is hardware configured to perform a search process for searching for a ground state of an Ising model that represents the combinatorial optimization problem. The host unit is hardware that is connected to the Ising machine via an interface and is configured to control the Ising machine. In the search process, the Ising machine is configured to: store a main variable and an auxiliary variable that correspond to each of a plurality of Ising spins included in the Ising model in association with each other; alternately repeat an auxiliary variable update process for updating the auxiliary variable by the main variable and a main variable update process for updating the main variable by the auxiliary variable multiple times for each of the plurality of Ising spins; and output, as a search result, a value based on the main variable corresponding to each of the plurality of Ising spins after alternately repeating the main variable update process and the auxiliary variable update process multiple times. The host unit is configured to: prior to the search process, transmit, to the Ising machine, an initial value of the auxiliary variable corresponding to each of the plurality of Ising spins; and after the search process, receive the search result from the Ising machine and output a solution of the combinatorial optimization problem based on the received search result.

First Embodiment

Figure 1:
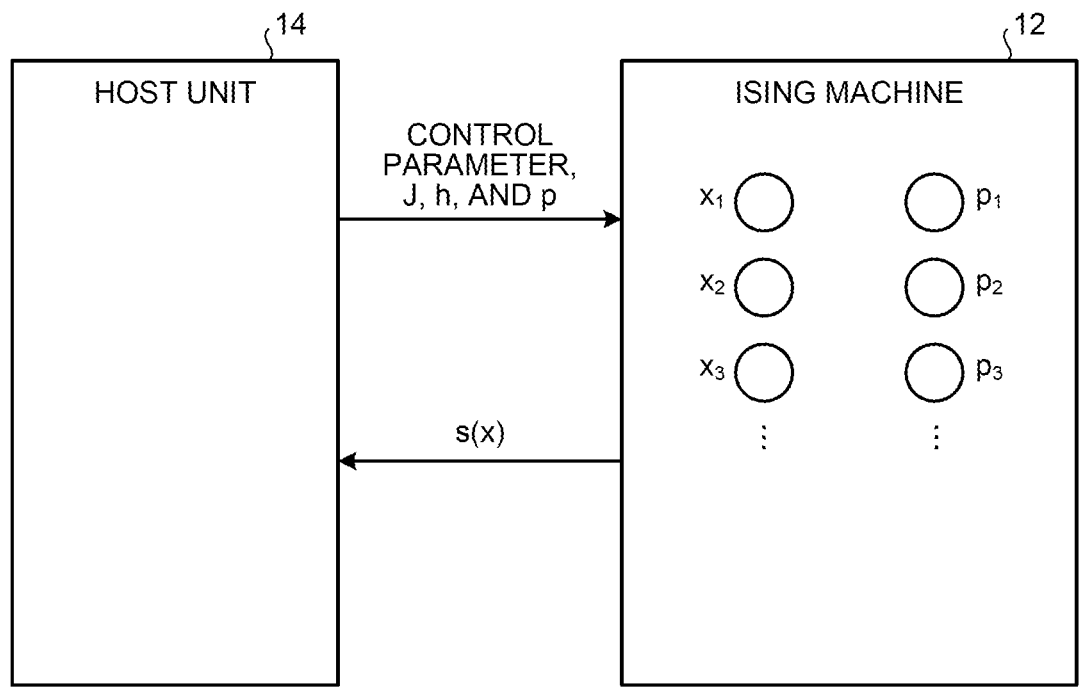
FIG. 1 is a diagram illustrating a functional configuration of an information processing system according to a first embodiment.

FIG. 1 is a diagram illustrating a functional configuration of an information processing system 10 according to a first embodiment.

The information processing system 10 is a device that solves a combinatorial optimization problem. The information processing system 10 according to the first embodiment includes an Ising machine 12 and a host unit 14.

The Ising machine 12 is hardware that performs a search process for searching for the ground state of an Ising model that represents the combinatorial optimization problem. The Ising machine 12 is a reconfigurable semiconductor device such as a field programmable gate array (FPGA). Note that, in the first embodiment, the Ising machine 12 does not have to be a reconfigurable semiconductor device. In the first embodiment, the Ising machine 12 may be, for example, a semiconductor device that is not reconfigurable or a processing circuit that performs information processing according to a program.

The host unit 14 is hardware that is connected to the Ising machine 12 via a physical interface and controls the Ising machine 12. The host unit 14 is a processing circuit that performs information processing according to a program. The host unit 14 performs a process other than the search process performed by the Ising machine 12 among a series of processes for solving the combinatorial optimization problem.

When searching for the ground state of the Ising model that represents the combinatorial optimization problem to be solved, the host unit 14 transmits, to the Ising machine 12 via the interface, a J matrix and h vector, which are definition information that defines the Ising model, a control parameter for controlling the search process performed by the Ising machine 12, and an initial value of each of a plurality of auxiliary variables ($p_1, p_2, p_3, \ldots$) (which will be described in detail later). Note that the host unit 14 may further transmit an initial value of each of a plurality of main variables ($x_1, x_2, x_3, \ldots$) (which will be described in detail later) to the Ising machine 12 via the interface.

The Ising machine 12 performs the search process for searching for the ground state of the Ising model defined by the J matrix and the h vector. At the start of the search process, the Ising machine 12 substitutes the initial value received from the host unit 14 in each of the plurality of auxiliary variables ($p_1, p_2, p_3, \ldots$). Further, at the start of the search process, the Ising machine 12 substitutes, as an initial value, a predetermined value such as 0 in each of the plurality of main variables ($x_1, x_2, x_3, \ldots$). The Ising machine 12 may generate a value based on a random number or the like, and substitute, as an initial value, the generated value in each of the plurality of main variables ($x_1, x_2, x_3, \ldots$). Note that in a case where the Ising machine 12 receives the initial value of each of the plurality of main variables ($x_1, x_2, x_3, \ldots$) from the host unit 14, the Ising machine 12 substitutes the received value in each of the plurality of main variables ($x_1, x_2, x_3, \ldots$). Further, the Ising machine 12 substitutes an initial value in each of the plurality of main variables ($x_1, x_2, x_3, \ldots$) and each of the plurality of auxiliary variables ($p_1, p_2, p_3, \ldots$), and then starts searching.

By performing the search process, the Ising machine 12 can calculate the values of the plurality of main variables ($x_1, x_2, x_3, \ldots$) that minimize Ising energy in the Ising model. Further, the Ising machine 12 transmits, as a search result, values of N Ising spins ($s_1, s_2, s_3, \ldots$) obtained by binarizing the respective values of the plurality of main variables ($x_1, x_2, x_3, \ldots$) after the search process, to the host unit 14 via the interface. The Ising machine 12 may transmit, as the search result, the values of the plurality of main variables ($x_1, x_2, x_3, \ldots$) after the search process, to the host unit 14. Then, the host unit 14 outputs a value of each of a plurality of Ising spins ($s_1, s_2, s_3, \ldots$) as the solution of the combinatorial optimization problem.

Figure 2:
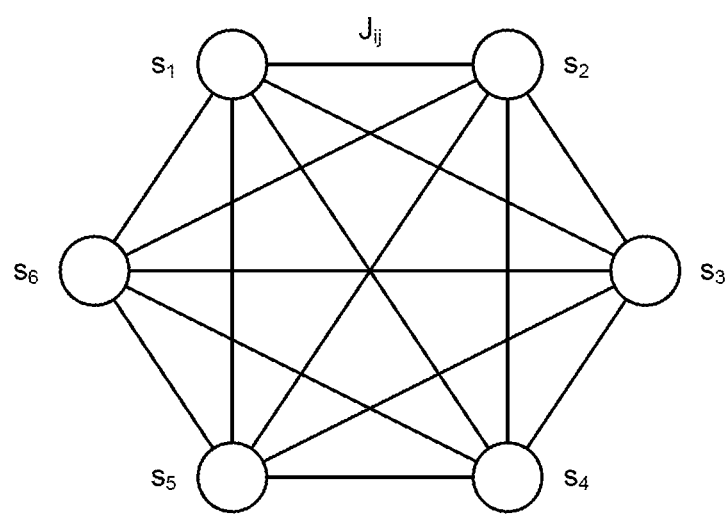
FIG. 2 is a diagram illustrating a graph representing an Ising model.

FIG. 2 is a diagram illustrating a graph representing the Ising model. Energy E(s) of the Ising model including N Ising spins is expressed by the following Equation (1).

$$E(s) = -\frac{1}{2}\sum_{i=1}^{N}\sum_{j=1}^{N} J_{i,j} s_i s_j + \sum_{i=1}^{N} h_i s_i \quad (1)$$

N is the number of Ising spins included in the Ising model, and is an integer of 3 or more. i and j represent indexes of the Ising spin and are integers greater than or equal to 1 and less than or equal to N. $s_i$ represents the i-th Ising spin. $s_j$ represents the j-th Ising spin. $s_i$ and $s_j$ represent either −1 or +1. Note that N Ising spins may be collectively referred to as an s vector ($s_1, s_2, \ldots,$ and $s_N$). The s vector represents the arrangement of −1 or +1 in N Ising spins.

$J_{ij}$ is an element in a row i and a column j in the J matrix. The J matrix is a square matrix of N rows and N columns, in which symmetric elements are the same as each other ($J_{ij}=J_{ji}$). In the Ising model, a coupling coefficient is defined for each of all pairs of two Ising spins included in N Ising spins. $J_{ij}$ represents a coupling coefficient that represents the interaction between the i-th Ising spin and the j-th Ising spin.

$h_i$ is the i-th element in the h vector. In the Ising model, an external magnetic field coefficient representing an external magnetic field that individually affects each of N Ising spins is defined. $h_i$ represents an external magnetic field coefficient that affects the i-th Ising spin.

The Ising problem having a size of N refers to a problem of calculating spin arrangement that minimizes the Ising energy for the Ising model including N Ising spins. The spin arrangement (S vector) that minimizes the energy is called the ground state.

FIG. 2 illustrates a graph representing the Ising model when N=6. A graph vertex corresponds to the Ising spin. A graph edge corresponds to the coupling coefficient $J_{ij}$ between the Ising spins. The external magnetic field coefficient $h_i$ is allocated to the graph vertex.

A general combinatorial optimization problem is represented as an Ising problem defined by the J matrix and the h vector. The Ising machine 12 receives the J matrix and h vector as the problem to be solved, internally searches for spin arrangement that implements lower Ising energy, and outputs the optimized spin arrangement as a solution.

Spin arrangement that implements minimum Ising energy corresponds to an exact solution. Spin arrangement that implements near-minimum Ising energy corresponds to an approximate solution. In general, the performance of the Ising machine 12 is expressed by the time required to output the solution and the accuracy of the solution (the lower the energy, the higher the accuracy of the solution). The Ising machine 12 may output not only an exact solution but also an approximate solution as a solution. Further, the search process for searching for the ground state includes not only a process for searching for an exact solution but also a process for searching for an approximate solution, the search process being performed by the Ising machine 12.

In addition, the Ising machine 12 capable of solving the Ising problem having a size of N can also solve the Ising problem having a size smaller than N. For example, the Ising machine 12 can search for the Ising problem having a size smaller than N as the Ising problem having a size of N by setting, to 0, a coupling coefficient and external magnetic field coefficient of an element without the Ising spin in the J matrix and h vector.

Conventionally, a simulated annealing (SA) method has been known as a method for solving the Ising problem. A device that performs a search process for the ground state of the Ising model according to the SA method is called an SA-based Ising machine.

Further, a simulated bifurcation (SB) method has been known as a solution for solving the Ising problem. The Ising machine 12 also performs the search process for the ground state of the Ising model by using the simulated bifurcation method. For example, the simulated bifurcation method has been proposed by Hayato Goto, Kosuke Tatsumura, Alexander R. Dixon, "Combinatorial optimization by simulating adiabatic bifurcations in nonlinear Hamiltonian systems", Science Advances, Vol. 5, no. 4, eaav2372, 19 Apr. 2019, JP 2019-145010 A, JP 2019-159566 A, JP 2020-046715 A, JP 2020-046766 A, JP 2020-046784 A, JP 2020-046887 A, and the like. The simulated bifurcation method is an algorithm in which the equation of motion in an optimization algorithm based on an adiabatic change in classical mechanics is modified into a form suitable for high-speed simulation. The Ising machine 12 performs the search process for the ground state of the Ising model by using such a simulated bifurcation method.

The simulated bifurcation method uses two variables, a main variable ($x_i$) and an auxiliary variable ($p_i$), each of which corresponds to N virtual particles. N particles correspond to N Ising spins. In the simulated bifurcation method, the main variable ($x_i$) represents the position of the i-th particle among N particles (i=1, 2, . . . , N). In the simulated bifurcation method, the auxiliary variable ($p_i$) represents the momentum of the i-th particle. Each of N main variables ($x_i$) and each of N auxiliary variables ($p_i$) are continuous variables represented by real numbers.

Further, in the simulated bifurcation method, for each of N virtual particles, for example, simultaneous ordinary differential equations of the following Equations (2) and (3) are numerically solved.

$$\frac{dx_i}{dt} = \frac{\partial H}{\partial p_i} = Dp_i \quad (2)$$

$$\frac{dp_i}{dt} = -\frac{\partial H}{\partial x_i} = \{-D + p(t) - Kx_i^2\}x_i - ch_i\alpha(t) + c\sum_{j=1}^{N} J_{i,j}x_j \quad (3)$$

Here, H is the Hamiltonian of the following Equation (4).

$$H = \sum_{i=1}^{N}\left[\frac{D}{2}(x_i^2 + p_i^2) - \frac{p(t)}{2}x_i^2 + \frac{K}{4}x_i^4 + ch_ix_i\alpha(t) - \frac{c}{2}\sum_{j=1}^{N}J_{i,j}x_ix_j\right] \quad (4)$$

c is a predetermined coefficient. D is a predetermined coefficient and corresponds to detuning. K is a coefficient corresponding to a positive Kerr coefficient. t is a variable that represents the time. p(t) corresponds to the pumping amplitude and is a function of which value monotonously increases according to the number of times of update at the time of calculation in the simulated bifurcation method. An initial value of p(t) may be set to 0. $\alpha(t)$ is a function that monotonically increases with p(t).

Here, the symplectic Euler method can be used to solve the differential equations given by Equations (2) and (3). As shown in the following Equations (5) and (6), the differential equation is rewritten into a discrete recurrence formula in a case where the symplectic Euler method is used.

$$x_i = x_i + Dp_i\Delta t \quad (5)$$

$$p_i = p_i + \left\{[-D + p(t) - Kx_i^2]x_i - ch_i\alpha(t) + c\sum_{j=1}^{N}J_{i,j}x_j\right\}\Delta t \quad (6)$$

$\Delta t$ is a time step (unit time or time increment).

Therefore, the Ising machine 12 alternately performs calculation of Equations (5) and (6) while increasing t by $\Delta t$ until t reaches a predetermined end time (T). Then, the Ising machine 12 outputs, as a search result, values of N Ising spins ($s_i$) obtained by binarizing each of the finally obtained N main variables ($x_i$), or the values of N main variables ($x_i$).

Note that the Ising machine 12 may perform an algorithm for calculating an equation other than Equations (3) and (4), as long as the algorithm uses the simulated bifurcation method. For example, the Ising machine 12 may perform an algorithm for calculating an equation obtained by modifying Equations (3) and (4). Further, for example, the Ising machine 12 may perform an algorithm for performing a predetermined control process in addition to calculation of Equations (3) and (4) or calculation of an equation obtained by modifying Equations (3) and (4).

As the Ising machine 12 changes the algorithm to be performed, performance indicators such as a convergence speed and resulting solution accuracy may change. Therefore, the algorithm applied to the Ising machine 12 may vary depending on the Ising problem to be solved and the purpose (putting emphasis on the convergence speed, accuracy, or the like). The Ising machine 12 may perform the search process by using an algorithm selected by a user among a plurality of preset algorithms. For example, when the Ising machine 12 is a reconfigurable semiconductor device, the host unit 14 reconfigures the semiconductor device based on circuit information indicating a circuit that performs the algorithm selected by the user. As a result, the Ising machine 12 can perform the search process for the ground state of the Ising model by using an appropriate circuit according to the Ising problem to be solved and the purpose.

Figure 3:
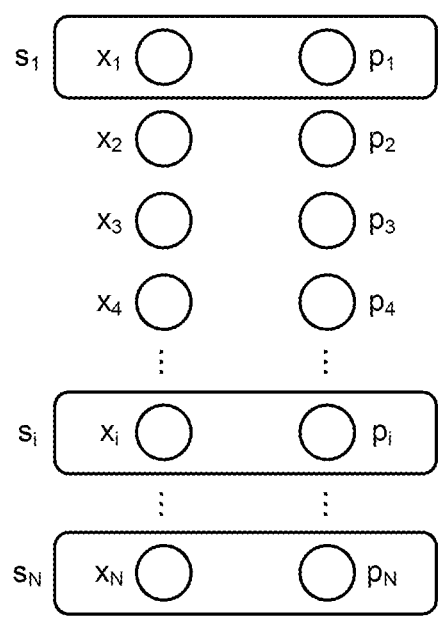
FIG. 3 is a diagram illustrating variables stored in an Ising machine.

FIG. 3 is a diagram illustrating variables stored in the Ising machine 12. The Ising machine 12 performs an algorithm using the simulated bifurcation method by using a hardware circuit. When performing the search process for the ground state of the Ising model including N Ising spins, the Ising machine 12 stores N main variables ($x_i$) and N auxiliary variables ($p_i$) in an internal memory or register.

As such, the Ising machine 12 stores 2×N variables therein. Therefore, the Ising machine 12 has a different configuration from the SA-based Ising machine that stores N variables. Note that the main variable ($x_i$) is converted into the Ising spin ($s_i$) by a binarization process. In contrast, the auxiliary variable ($p_i$) is not used for conversion into the Ising spin ($s_i$).

Further, each of N main variables ($x_i$) and each of N auxiliary variables ($p_i$) are initialized at the start of the search process. The Ising machine 12 may output different (approximate) solutions in a case where the initial value of the auxiliary variable ($p_i$) is different, even for problems with the same J matrix and h vector. Therefore, the Ising machine 12 can obtain a more accurate solution by changing the initial value of the auxiliary variable ($p_i$) and performing the search process for the problems with the same J matrix and h vector.

Figure 4:
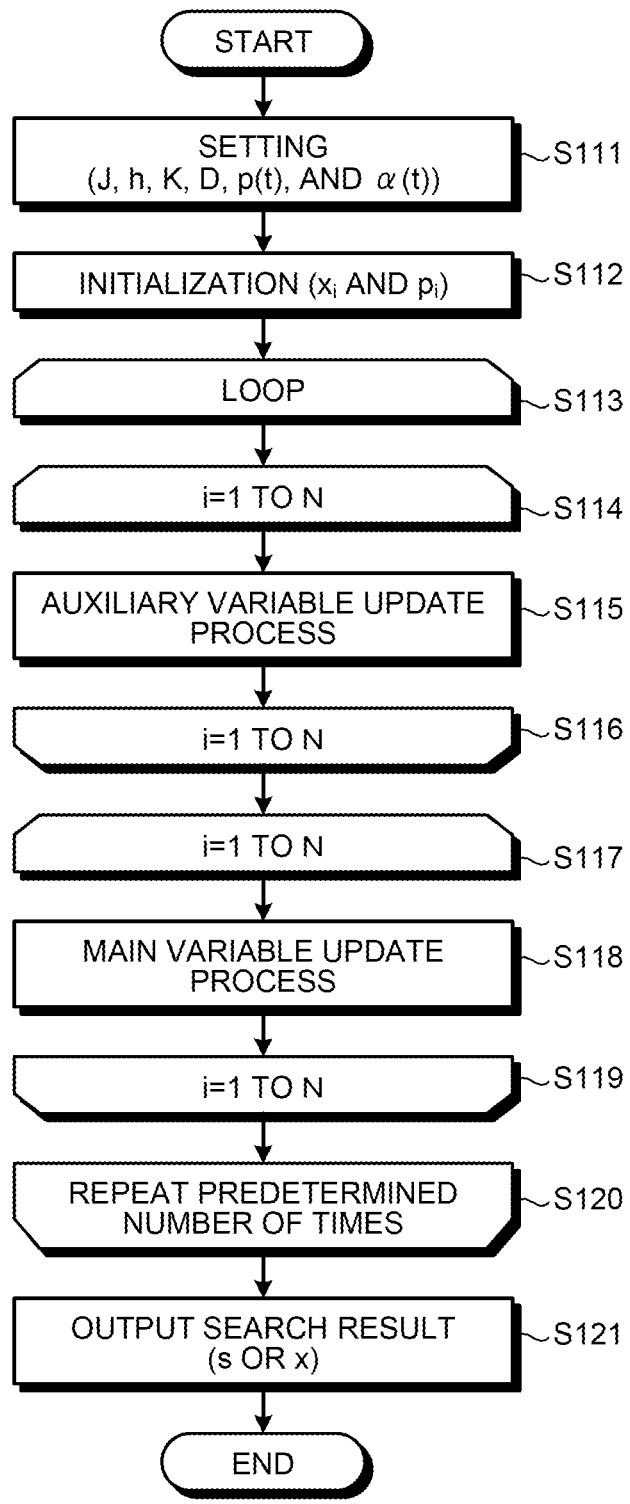
FIG. 4 is a flowchart illustrating a flow of a search process performed by the Ising machine.

FIG. 4 is a flowchart illustrating a flow of the search process performed by the Ising machine 12. The Ising machine 12 performs the search process according to the flow illustrated in FIG. 4.

First, at S111, the Ising machine 12 performs a setting process. Specifically, the Ising machine 12 sets, for example, coefficients of K and D, functions such as p(t) and α(t), and the number of repetitions. Further, the Ising machine 12 sets the J matrix and the h vector based on the definition information received from the host unit 14.

Next, at S112, the Ising machine 12 initializes the value of each of N main variables ($x_1$ to $x_N$) and the value of each of N auxiliary variables ($p_1$ to $p_N$). For example, the Ising machine 12 sets the value of each of N main variables ($x_1$ to $x_N$) to 0, a predetermined value, or a value determined by a random number within a predetermined range. Further, in a case where the Ising machine 12 receives the initial value of each of N main variables ($x_1$ to $x_N$) from the host unit 14, the Ising machine 12 sets the value of each of N main variables ($x_1$ to $x_N$) to the initial value received from the host unit 14. Further, the Ising machine 12 sets the value of each of N auxiliary variables ($p_1$ to $p_N$) to the initial value received from the host unit 14.

Next, the Ising machine 12 repeats a loop process from S113 to S120 a set number of times.

At S114 to S116 in the loop, the Ising machine 12 performs an auxiliary variable update process while incrementing i by 1 from i=1 to i=N (S114, S115, and S116). In the auxiliary variable update process (S115) for updating the i-th auxiliary variable, the Ising machine 12 updates the i-th auxiliary variable ($p_i$) by N main variables ($x_1$ to $x_N$), N coupling coefficients ($J_{i,j}$) representing the interaction between the i-th main variable ($x_i$) and the remaining (N−1) main variables ($x_{1\ to\ i-1}$ and $x_{i+1\ to\ N}$), and the i-th external magnetic field coefficient ($h_j$).

Specifically, the Ising machine 12 calculates the i-th auxiliary variable ($p_i$) by calculating Equation (6) described above.

Note that the Ising machine 12 may perform the process of S115 in parallel. As a result, the Ising machine 12 can calculate N auxiliary variables ($p_1$ to $p_N$) at high speed.

Next, at S117 to S119, the Ising machine 12 performs a main variable update process while incrementing i by 1 from i=1 to i=N (S117, S118, and S119). In the main variable update process (S118) for updating the i-th main variable, the Ising machine 12 updates the i-th main variable ($x_i$) by the i-th auxiliary variable ($p_i$).

Specifically, the Ising machine 12 calculates the i-th main variable ($x_i$) by calculating Equation (5) described above.

Note that the Ising machine 12 may perform the process of S118 in parallel. As a result, the Ising machine 12 can calculate N main variables ($x_1$ to $x_N$) at high speed.

Then, when the loop process between S113 and S120 is performed a set number of times, the Ising machine 12 proceeds to S121. Note that, in the loop process from S113 to S120, the Ising machine 12 may perform the process of S117 to S119 first and the process of S114 to S116 later.

At S121, the Ising machine 12 outputs a search result to the host unit 14. For example, the Ising machine 12 outputs, to the host unit 14, N Ising spins ($s_1$ to $s_N$) obtained by binarizing each of N main variables ($x_1$ to $x_N$) or N main variables ($x_1$ to $x_N$). Then, when the process of S121 is completed, the Ising machine 12 ends the search process.

As described above, for each of N Ising spins ($s_1$ to $s_N$), the Ising machine 12 alternately repeats the auxiliary variable update process (S115) for updating the auxiliary variable by the main variable and the main variable update process (S118) for updating the main variable by the auxiliary variable multiple times. Further, the Ising machine 12 outputs, as the search result, a value based on the main variable after the auxiliary variable update process (S115) and the main variable update process (S118) are alternately performed multiple times. As a result, the Ising machine 12 can perform the search process for the ground state of the Ising model by performing an algorithm using the simulated bifurcation method.

Figure 5:
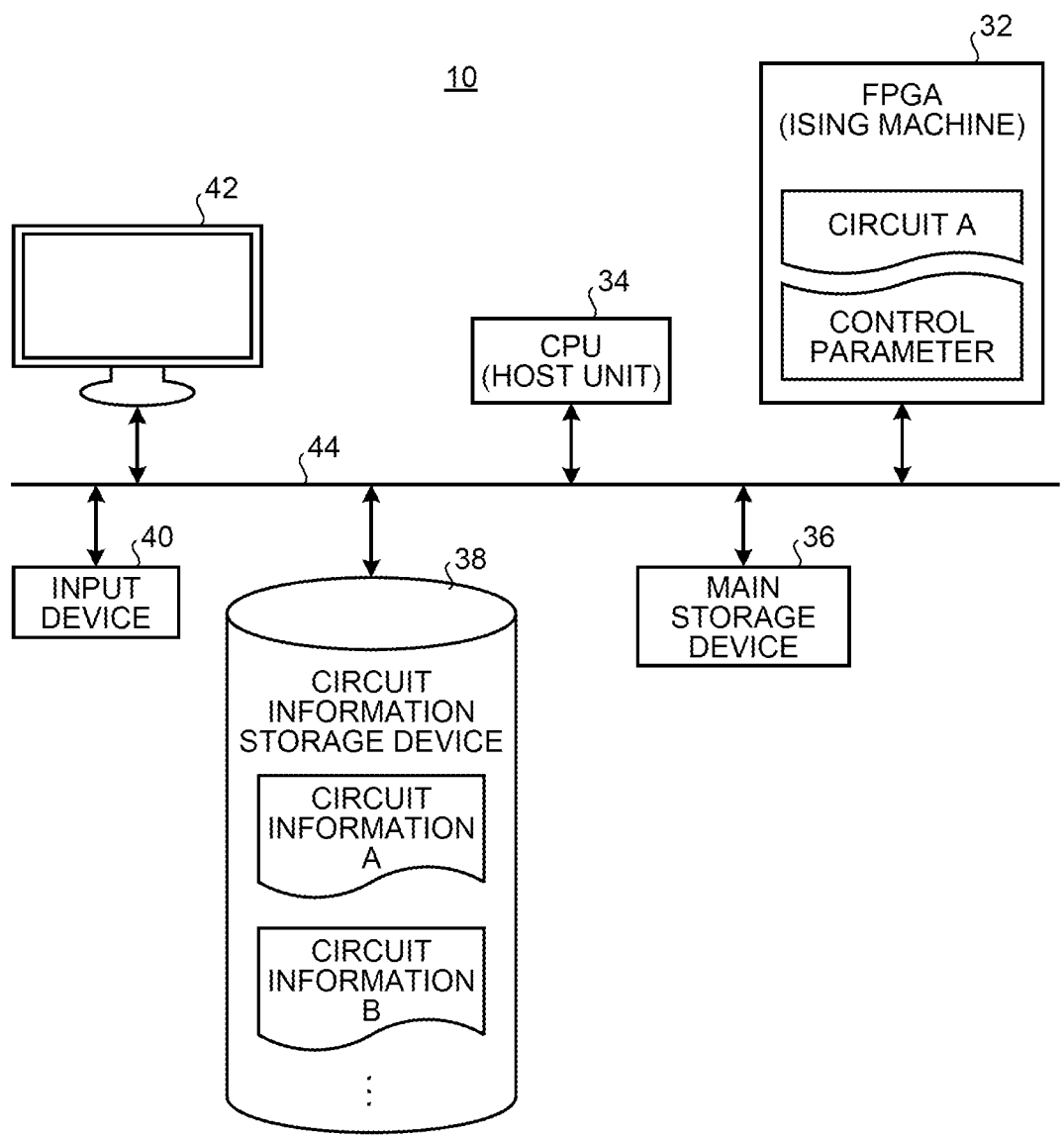
FIG. 5 is a diagram illustrating a hardware configuration of the information processing system.

FIG. 5 is a diagram illustrating an example of a hardware configuration of the information processing system 10. For example, the information processing system 10 includes an FPGA 32, a central processing unit (CPU) 34, a main storage device 36, a circuit information storage device 38, an input device 40, a display device 42, and a bus 44.

The FPGA 32 receives circuit information from the CPU 34 via the bus 44, and is configured as a circuit predetermined according to the received circuit information. As a result, the FPGA 32 functions as the Ising machine 12.

The FPGA 32 receives the definition information and the control parameter from the CPU 34 via the bus 44, and performs the search process according to the received definition information and control parameter. The definition information is information that defines the Ising model. Specifically, the definition information is the J matrix and the h vector. The control parameter is information for controlling the search process. For example, the control parameter is a coefficient (c, D, or K), a function (α(t) or p(t)), a unit time (Δt), or the number of repetitions of the loop process.

Further, prior to the search process, the FPGA 32 receives, from the CPU 34 via the bus 44, the initial value of each of N auxiliary variables ($p_i$) corresponding to the plurality of Ising spins included in the Ising model, the initial value being stored in the main storage device 36. Moreover, prior to the search process, the FPGA 32 may receive, from the CPU 34 via the bus 44, the initial value of each of N main variables ($x_i$) corresponding to the plurality of Ising spins, the initial value being stored in the main storage device 36.

Then, after the search process is completed, the FPGA 32 outputs the search result to the host unit 14 via the bus 44. Specifically, the FPGA 32 outputs, as the search result, the value of the Ising spin ($s_i$) obtained by binarizing each of the main variables ($x_i$) corresponding to each of the plurality of Ising spins, or the value of each of the plurality of main variables ($x_i$) to the host unit 14.

The CPU 34 is operated according to a program stored in the main storage device 36. As a result, the CPU 34 and the main storage device 36 function as the host unit 14.

The CPU 34 performs a preprocess, a parameter transmission process, a result reception process, and a main process. The CPU 34 generates the definition information and the control parameter in the preprocess. In addition, the CPU 34 generates the initial value of each of the plurality of auxiliary variables ($p_i$) in the preprocess. The CPU 34 may further generate the initial value of each of the plurality of main variables ($x_i$) in the preprocess.

In the parameter transmission process, the CPU 34 transmits the definition information, the control parameter, and the initial value of each of the plurality of auxiliary variables ($p_i$) to the FPGA 32 via the bus 44. In the parameter transmission process, the CPU 34 may further transmit the initial value of each of the plurality of main variables ($x_i$) to the FPGA 32 via the bus 44.

In the result reception process, the CPU 34 receives the search result from the FPGA 32 via the bus 44, and outputs the solution of the combinatorial optimization problem based on the received search result. Further, the CPU 34 performs, as the main process, a process other than the preprocess, the parameter transmission process, and the result reception process.

The main storage device 36 is a random access memory (RAM). The main storage device 36 is used as a work area for data processing of the CPU 34.

The circuit information storage device 38 is a non-volatile storage device. The circuit information storage device 38 stores circuit information for configuring the FPGA 32 as a circuit for searching for the ground state of the Ising model.

The circuit information storage device 38 may store a plurality of circuit informations. The plurality of respective circuit informations may be, for example, informations indicating circuits that the maximum sizes of the Ising model that can be solved are different from each other. Further, the plurality of respective circuit information may be, for example, information indicating circuits that perform the search process using algorithms different from each other. The CPU 34 selects circuit information specified by the user among the plurality of circuit informations, and reconfigures the FPGA 32 according to the selected circuit information.

The input device 40 is a device for inputting an instruction or the like from the user. The input device 40 is, for example, a mouse, a keyboard, or the like. The input device 40 receives a process start instruction from the user. When the input device 40 receives the start instruction from the user, the CPU 34 starts the process for calculating the solution of the combinatorial optimization problem.

The display device 42 is a device for displaying information to the user. The display device 42 displays the solution of the combinatorial optimization problem.

The bus 44 connects the FPGA 32, the CPU 34, the main storage device 36, the circuit information storage device 38, the input device 40, and the display device 42 to transmit and receive data. The bus 44 functions as an interface connecting the Ising machine 12 and the host unit 14.

Figure 6:
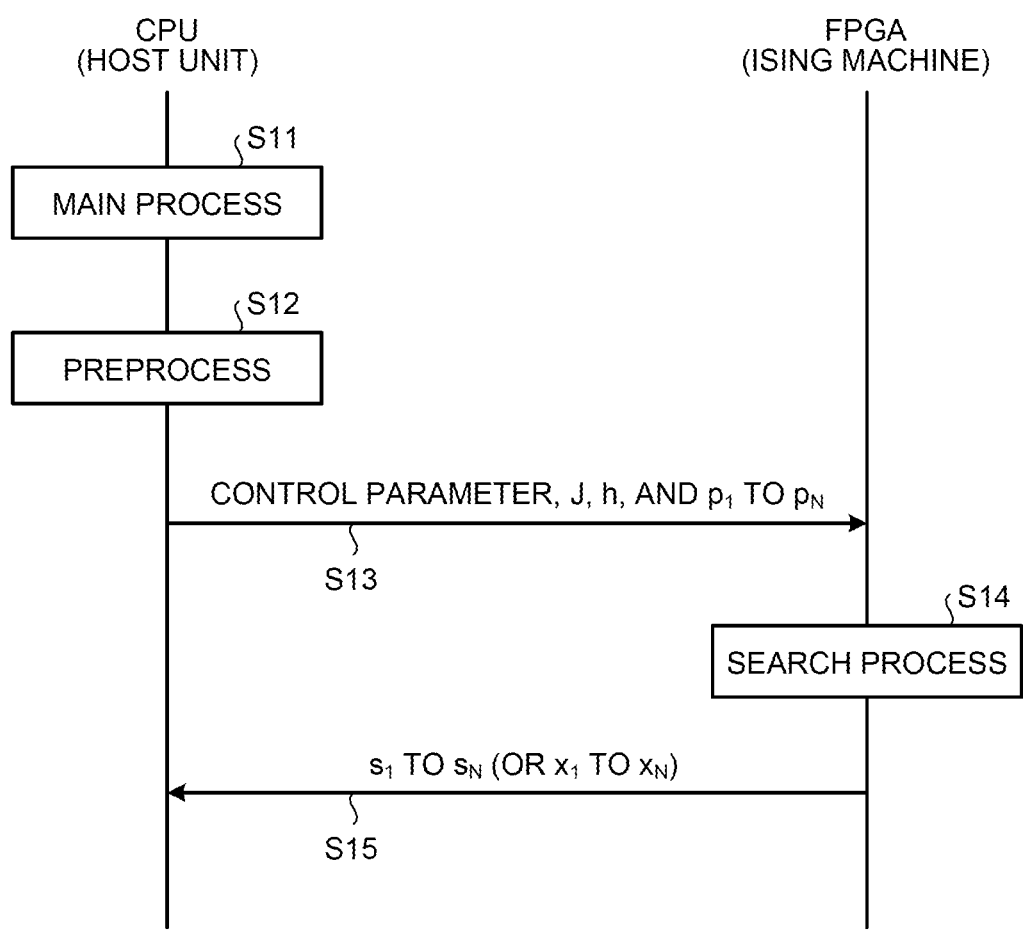
FIG. 6 is a sequence diagram illustrating a process flow of the information processing system.

FIG. 6 is a sequence diagram illustrating a process flow of the information processing system 10. In a case where the FPGA 32 calculates the solution of the Ising model including N Ising spins, the information processing system 10 performs the process according to the flow illustrated in FIG. 6.

First, at S11, the CPU 34 performs the main process. Next, at S12, the CPU 34 performs the preprocess. Specifically, in the preprocess, the CPU 34 generates the definition information (J and h), the control parameter, and the initial value of each of N auxiliary variables ($p_1$ to $p_N$) in association with the Ising machine 12 configured in the FPGA 32. Further, the CPU 34 may generate the initial value of each of N main variables ($x_1$ to $x_N$).

Next, at S13, the CPU 34 transmits, to the FPGA 32 via the bus 44, the definition information (J and h), the control parameter, and the initial value of each of N auxiliary variables ($p_1$ to $p_N$). Further, the CPU 34 may transmit the initial value of each of N main variables ($x_1$ to $x_N$) to the FPGA 32 via the bus 44.

Next, at S14, the FPGA 32 performs the search process. Specifically, for each of N Ising spins, the FPGA 32 alternately repeats the auxiliary variable update process for updating the auxiliary variable ($p_i$) by the main variable ($x_i$) and the main variable update process for updating the main variable ($x_i$) by the auxiliary variable ($p_i$) multiple times. Specifically, the FPGA 32 performs the process illustrated in FIG. 4.

Note that, at the start of the search process, the FPGA 32 sets the initial value received from the CPU 34 for each of N auxiliary variables ($p_i$). Further, at the start of the search process, the FPGA 32 sets a predetermined value such as 0 as the initial value for each of N main variables ($x_i$). Further, the FPGA 32 may internally generate a value corresponding to a random number or the like as the initial value and set the generated value for each of N main variables ($x_i$). Note that in a case where the FPGA 32 receives the initial value of each of N main variables ($x_i$) from the CPU 34, the FPGA 32 sets the initial value received from the CPU 34 for each of N main variables ($x_i$).

Next, at S14, the FPGA 32 transmits a search result to the CPU 34. Specifically, the FPGA 32 transmits, to the CPU 34 via the bus 44, N Ising spins ($s_1$ to $s_N$) obtained by binarizing each of N main variables ($x_1$ to $x_N$), or N main variables ($x_1$ to $x_N$). Next, at S15, the CPU 34 receives the search result from the FPGA 32 via the bus 44.

As described above, in the information processing system 10 according to the present embodiment, in addition to the definition information (J and h) that defines the Ising model, and the control parameter, the initial value of each of the plurality of auxiliary variables ($p_i$) is transmitted from the host unit 14 (the CPU 34 and the main storage device 36) to the Ising machine 12 (the FPGA 32) via the interface (the bus 44). The Ising machine 12 (the FPGA 32) can output a different approximate solution in a case where the initial value of the auxiliary variable ($p_i$) is different, even when the value of the main variable ($x_i$) is fixed. That is, even in a case where the host unit 14 (the CPU 34) does not transmit the initial value of the main variable ($x_i$) to the Ising machine 12 (the FPGA 32), when the initial value of the auxiliary variable ($p_i$) is changed, the Ising machine 12 (the FPGA 32) can perform an appropriate search process. Therefore, the information processing system 10 according to the present embodiment does not need to generate and transmit the main variable ($x_i$), and can shorten the process time and the communication time. As described above, with the information processing system 10 according to the present embodiment, the solution of the combinatorial optimization problem can be calculated at high speed.

Second Embodiment

Next, an information processing system 10 according to a second embodiment will be described. The information processing system 10 according to the second embodiment has almost the same configuration as that of the first embodiment. Therefore, in the description of the information processing system 10 according to the second embodiment, the same components as those of the first embodiment are designated by the same reference signs, and a detailed description thereof will be omitted.

The information processing system 10 according to the second embodiment solves a plurality of combinatorial optimization problems one by one.

Figure 7:
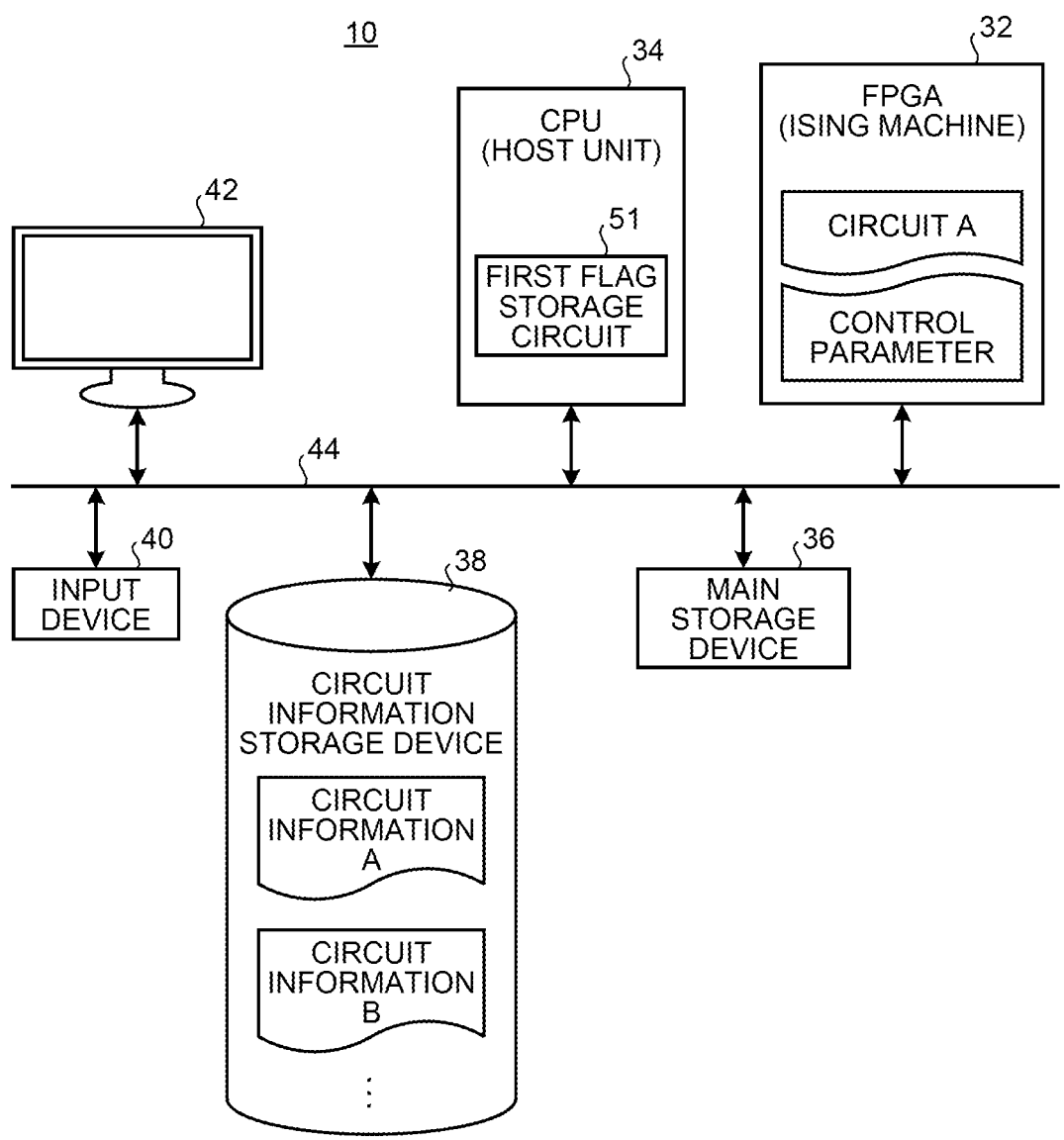
FIG. 7 is a diagram illustrating a hardware configuration of an information processing system according to a second embodiment.

FIG. 7 is a diagram illustrating a hardware configuration of the information processing system 10 according to the second embodiment. A CPU 34 according to the second embodiment includes a first flag storage circuit 51. The first flag storage circuit 51 stores a first flag indicating whether or not a search process performed by an FPGA 32 is completed.

The first flag storage circuit 51 is, for example, a flag register provided in the CPU 34. The first flag storage circuit 51 may be provided outside the CPU 34 (for example, a main storage device 36).

The CPU 34 can write and read the first flag in and from the first flag storage circuit 51. At the same time, the first flag is set in the first flag storage circuit 51 according to an operating state of the FPGA 32. For example, the first flag of 0 indicates that the search process performed by the FPGA 32 is not completed, and the first flag of 1 indicates that the search process performed by the FPGA 32 is completed.

Further, in the second embodiment, instead of the FPGA 32, the CPU 34 can also perform the search process. In this case, the CPU 34 performs the search process by executing a predetermined search program.

Figure 8:
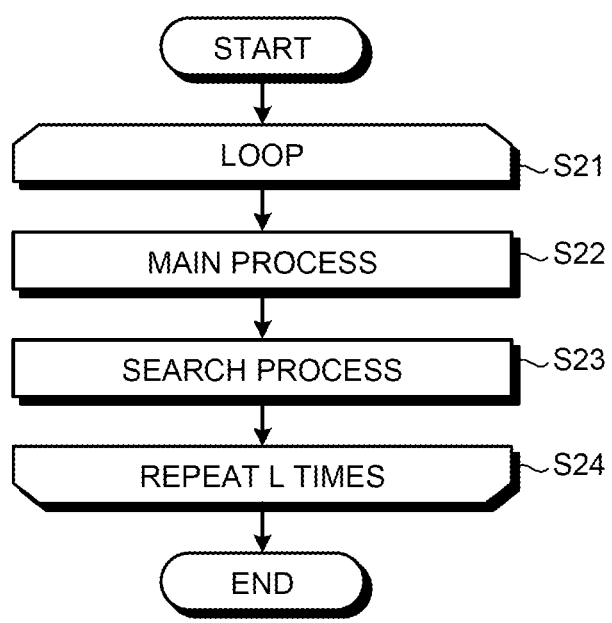
FIG. 8 is a flowchart of a first example of the second embodiment.

FIG. 8 is a flowchart illustrating a process flow of the CPU 34 according to a first example of the second embodiment. In the first example, in the information processing system 10, instead of the FPGA 32, the CPU 34 performs the search process. In the first example, the CPU 34 performs the process according to the flow illustrated in FIG. 8.

In the first example, the CPU 34 performs loop process between S21 and S24 L times. L represents the number of combinatorial optimization problems to be solved and is a predetermined integer of 2 or more. The CPU 34 performs the main process (S22) and the search process (S23) in each loop process. Note that the main process (S22) is the same as the process of S11 illustrated in FIG. 6. Further, the search process (S23) is the same as the process of S14 illustrated in FIG. 6. Then, when the loop process is performed L times, the CPU 34 ends this flow (S24).

Figure 9:
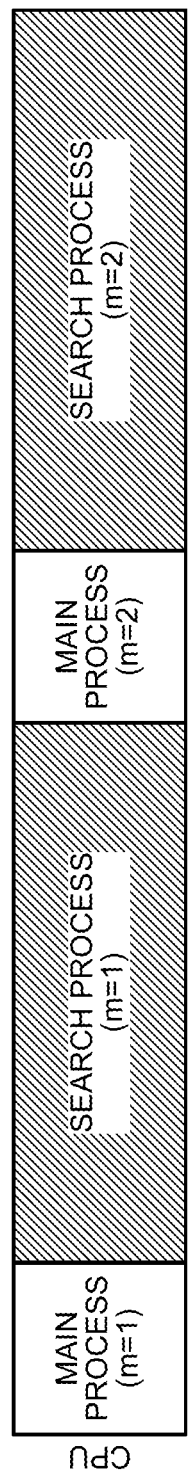
FIG. 9 is a timing chart of the first example of the second embodiment.

FIG. 9 is a timing chart of the process performed by the information processing system 10 according to the first example of the second embodiment. m represents an index of the combinatorial optimization problem to be solved and is an integer from 1 to L. The information processing system 10 sequentially solves the combinatorial optimization problem of m=1 to the combinatorial optimization problem of m=L while incrementing m by 1.

As illustrated in FIG. 9, in the first example, the CPU 34 alternately repeats the main process and the search process. As a result, the information processing system 10 according to the first example of the second embodiment can sequentially solve a plurality of combinatorial optimization problems.

Figure 10:
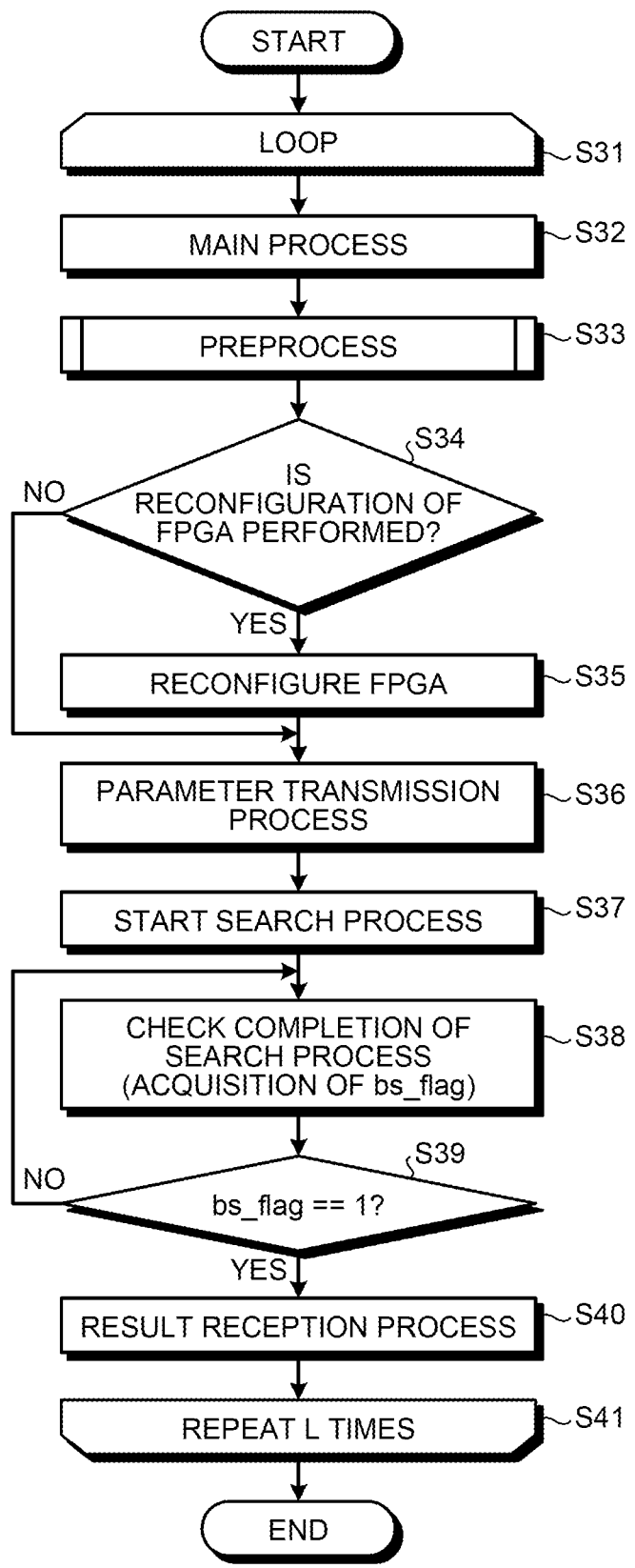
FIG. 10 is a flowchart of a second example of the second embodiment.

FIG. 10 is a flowchart illustrating a process flow of the CPU 34 according to a second example of the second embodiment. In the second example, in the information processing system 10, the FPGA 32 performs the search process, and the CPU 34 performs a process other than the search process. In the second example, the CPU 34 performs the process according to the flow illustrated in FIG. 10.

In the second example, the CPU 34 performs loop process between S31 and S41 L times. The CPU 34 performs the processes from S32 to S40 in each loop process.

At S32, the CPU 34 performs a main process. The main process (S32) is the same as the process of S11 illustrated in FIG. 6. Next, at S33, the CPU 34 performs a preprocess. The preprocess of S33 will be described later with reference to FIG. 11.

Next, at S34, the CPU 34 determines whether or not to reconfigure the FPGA 32. For example, the CPU 34 determines whether or not a circuit currently configured in the FPGA 32 supports the Ising model that represents the combinatorial optimization problem to be solved. Then, in a case where the circuit supports the Ising model, the CPU 34 determines not to perform the reconfiguration, and in a case where the circuit does not support the Ising model, the CPU 34 determines to perform the reconfiguration. In a case where the reconfiguration is not performed (No at S34), the CPU 34 proceeds to S36. In a case where the reconfiguration is performed (Yes at S34), the CPU 34 proceeds to S35. At S35, the CPU 34 provides, to the FPGA 32, circuit information corresponding to the Ising model representing the combinatorial optimization problem to be solved, and reconfigures the FPGA 32.

Next, at S36, the CPU 34 transmits a parameter generated in the preprocess (S33) to the FPGA 32. Specifically, the CPU 34 transmits, to the FPGA 32 via a bus 44, the definition information (J and h), the control parameter, and the initial value of each of N auxiliary variables ($p_1$ to $p_N$). Further, the CPU 34 may transmit the initial value of each of N main variables ($x_1$ to $x_N$) to the FPGA 32 via the bus 44.

Next, at S37, the CPU 34 instructs the FPGA 32 to start the search process. Note that, prior to the start of the search process, the FPGA 32 sets the first flag (bs_flag) to 0 which is a value indicating that the search process is not completed. Further, when the search process is completed, the FPGA 32 sets the first flag (bs_flag) to 1 which is a value indicating that the search process is completed.

Next, at S38, the CPU 34 checks whether or not the search process performed by the FPGA 32 is completed. Specifically, the CPU 34 acquires the first flag (bs_flag).

Next, at S39, the CPU 34 determines whether or not the search process is completed. In a case where the search process is completed, that is, in a case where bs_flag is 1 (bs_flag=1) (Yes at S39), the CPU 34 proceeds to S40. In a case where the search process is not completed, that is, in a case where bs_flag is not 1 (No at S39), the CPU 34 returns to S38 and repeats the process of S38 and S39. That is, the CPU 34 performs polling, which is a process for repeatedly checking the first flag (bs_flag) in order to confirm that the search process is completed, from when the CPU 34 instructs the start of the search process to when the search process is completed.

At S40, the CPU 34 receives a search result from the FPGA 32. Then, when the loop process is performed L times, the CPU 34 ends this flow (S41).

Figure 11:
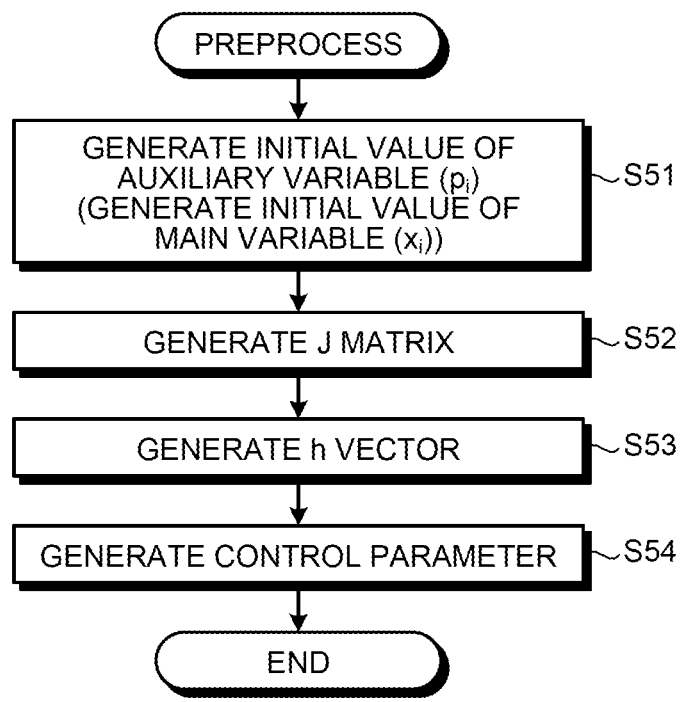
FIG. 11 is a flowchart illustrating a flow of a preprocess.

FIG. 11 is a flowchart illustrating a flow of the preprocess (S33). The CPU 34 performs the processes from S51 to S54 in the preprocess (S33).

At S51, the CPU 34 generates the initial value of each of N auxiliary variables ($p_1$ to $p_N$). Note that the CPU 34 may further generate the initial value of each of N main variables ($x_i$).

Next, at S52, the CPU 34 generates the J matrix. Next, at S53, the CPU 34 generates the h vector. Next, at S54, the CPU 34 generates the control parameter such as a coefficient (c, D, or K), a function ($\alpha(t)$ or $p(t)$), a unit time ($\Delta t$), or the number of repetitions. When the process of S54 is completed, the CPU 34 returns to the flow of FIG. 10.

Figure 12:
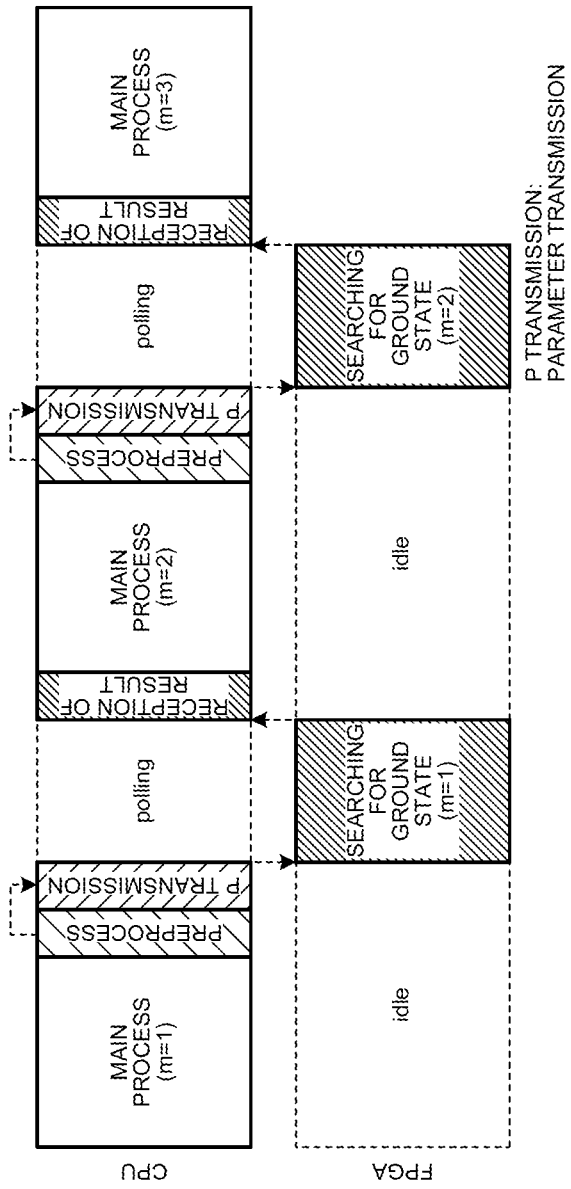
FIG. 12 is a timing chart of the second example of the second embodiment.

FIG. 12 is a timing chart of the process performed by the information processing system 10 according to the second example of the second embodiment. As illustrated in FIG. 12, in the second example of the second embodiment, after the CPU 34 performs the main process, the preprocess, and the parameter transmission process, the FPGA 32 performs the search process. While the FPGA 32 performs the search process, the CPU 34 checks, by polling, whether or not the search process is completed, and performs the result reception process after the search process is completed. Then, the CPU 34 starts the main process of the next problem after the result reception process is performed. As described above, in the information processing system 10 according to the second example of the second embodiment, the CPU 34 and the FPGA 32 perform the process at an exclusive timing. As a result, the information processing system 10 according to the second example of the second embodiment can sequentially solve a plurality of combinatorial optimization problems.

Here, the FPGA 32 can configure a circuit that calculates N main variables ($x_1$ to $x_N$) and N auxiliary variables ($p_1$ to $p_N$) in parallel. Therefore, the FPGA 32 can perform large-scale parallel calculation. On the other hand, in general, the CPU 34 cannot perform large-scale parallel calculation, because the number of cores and the number of threads are limited. Therefore, although the preprocess, the parameter transmission process, and the result reception process are additionally performed in the information processing system 10 according to the second example, the search process can be significantly shortened, as compared with the information processing system 10 according to the first example. Therefore, the information processing system 10 according to the second example can increase the throughput as a whole.

Third Embodiment

Next, an information processing system 10 according to a third embodiment will be described. The information processing system 10 according to the third embodiment has almost the same configuration as that of the second embodiment. Therefore, in the description of the information processing system 10 according to the third embodiment, the same components as those of the second embodiment are designated by the same reference signs, and a detailed description thereof will be omitted.

The information processing system 10 according to the third embodiment sequentially solves a plurality of combinatorial optimization problems one by one, and in the information processing system 10 according to the third embodiment, the main process and the search process are performed by a CPU 34 and an FPGA 32, respectively, in parallel.

Figure 13:
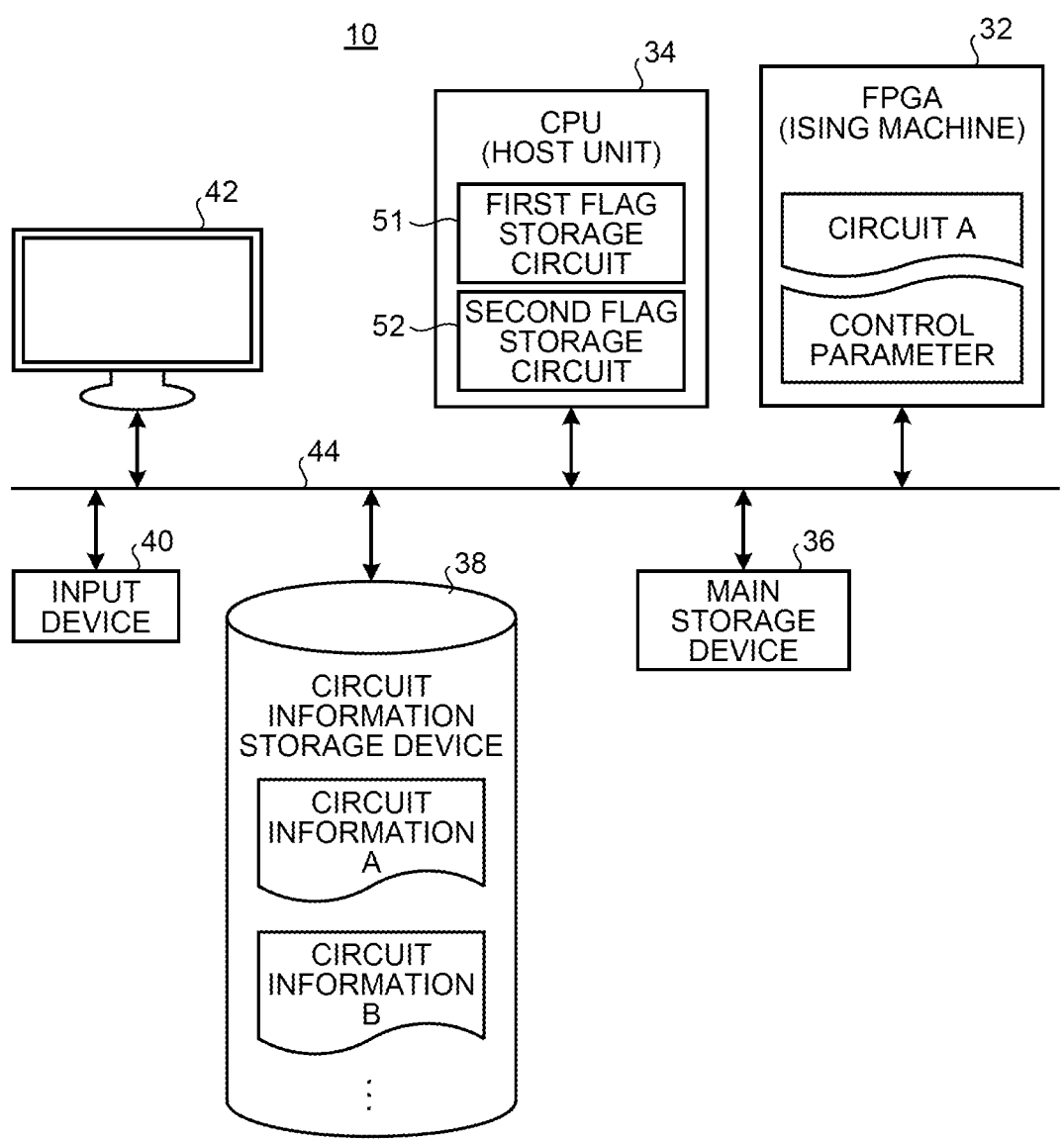
FIG. 13 is a diagram illustrating a functional configuration of an information processing system according to a third embodiment.

FIG. 13 is a diagram illustrating a functional configuration of the information processing system 10 according to the third embodiment. The CPU 34 according to the third embodiment further includes a second flag storage circuit 52, which is different from the configuration of the second embodiment illustrated in FIG. 7. The second flag storage circuit 52 stores a second flag indicating whether or not the CPU 34 has received a search result from the FPGA 32. The second flag storage circuit 52 is, for example, a flag register provided in the CPU 34. The second flag storage circuit 52 may be provided outside the CPU 34 (for example, a main storage device 36).

The CPU 34 can perform writing and reading with respect to the second flag storage circuit 52. For example, the second flag of 0 indicates that the CPU 34 has not received the search result, and the second flag of 1 indicates that the CPU 34 has received the search result.

Figure 14:
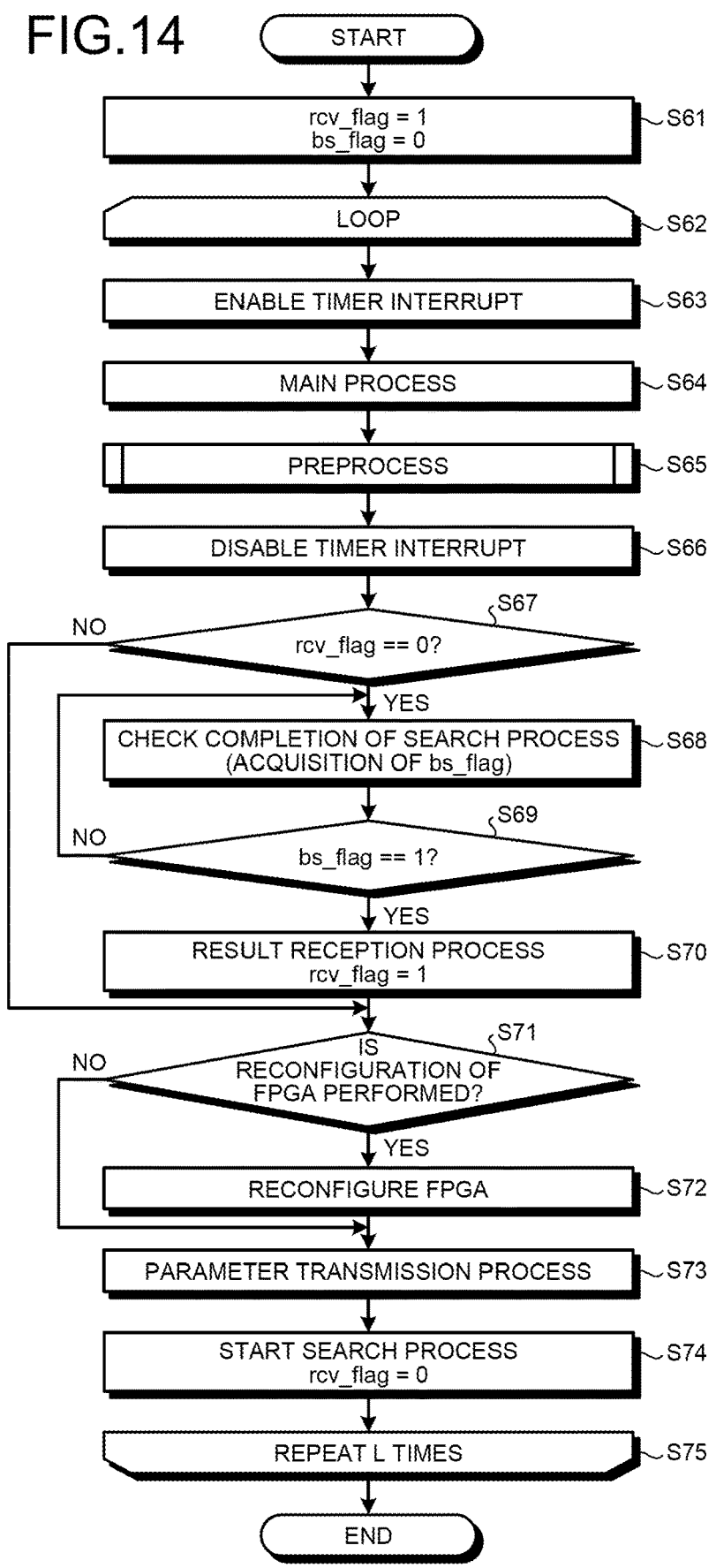
FIG. 14 is a flowchart of the third embodiment.

FIG. 14 is a flowchart illustrating a process flow of the CPU 34 according to the third embodiment. The CPU 34 according to the third embodiment performs the process according to the flow illustrated in FIG. 14.

First, at S61, the CPU 34 sets a first flag (bs_flag) to 0 which is a value indicating that the search process is not completed. Further, the CPU 34 sets the second flag (rcv_flag) to 1 which is a value indicating that the search result has been received.

Next, the CPU 34 performs loop process between S62 and S75 L times. The CPU 34 performs the processes from S63 to S74 in each loop process.

At S63, the CPU 34 enables a timer interrupt. A timer generates a timer flag at predetermined time intervals. When the timer interrupt is enabled, the CPU 34 performs the process illustrated in FIG. 15 as described later each time the timer flag is generated.

Next, at S64, the CPU 34 performs the main process. The main process (S64) is the same as the process of S32 illustrated in FIG. 10.

Next, at S65, the CPU 34 performs the preprocess. The preprocess (S65) is the same as the process of S33 illustrated in FIG. 10.

Next, at S66, the CPU 34 disables the timer interrupt enabled at S63. Thereafter, the CPU 34 does not perform the process illustrated in FIG. 15 even when the timer flag is generated, until the timer interrupt is enabled again.

Next, at S67, the CPU 34 determines whether or not the second flag (rcv_flag) indicates that a search result has not been received. In a case where the second flag (rcv_flag) indicates that the search result has been received, that is, in a case where rcv_flag is not 0 (No at S67), the CPU 34 proceeds to S71. In a case where the second flag (rcv_flag) indicates that the search result has not been received, that is, in a case where rcv_flag is 0 (rcv_flag=0) (Yes at S67), the CPU 34 proceeds to S68.

Next, at S68, the CPU 34 checks whether or not the search process performed by the FPGA 32 is completed. Specifically, the CPU 34 acquires the first flag (bs_flag).

Next, at S69, the CPU 34 determines whether or not the search process is completed. In a case where the search process is completed, that is, in a case where bs_flag is 1 (bs_flag=1) (Yes at S69), the CPU 34 proceeds to S70. In a case where the search process is not completed, that is, in a case where bs_flag is not 1 (No at S69), the CPU 34 returns to S68 and repeats the process of S68 and S69. That is, the CPU 34 performs polling for confirming that the search process is completed, from when the CPU 34 instructs the start of the search process to when the search process is completed.

At S70, the CPU 34 receives a search result from the FPGA 32. Further, the CPU 34 sets the second flag (rcv_flag) to 1 which is a value indicating that the search result has been received, when the reception of the search result is completed.

Next, at S71, the CPU 34 determines whether or not to reconfigure the FPGA 32. In a case where the reconfiguration is not performed (No at S71), the CPU 34 proceeds to S73. In a case where the reconfiguration is performed (Yes at S71), the CPU 34 proceeds to S72. At S72, the CPU 34 provides, to the FPGA 32, circuit information corresponding to the Ising model representing the combinatorial optimization problem to be solved, and reconfigures the FPGA 32.

Next, at S73, the CPU 34 transmits a parameter generated in the preprocess (S65) to the FPGA 32. The parameter transmission process (S73) is the same as the process of S36 illustrated in FIG. 10.

Next, in S74, the CPU 34 instructs the FPGA 32 to start the search process. Further, the CPU 34 sets the second flag (rcv_flag) to 0 which is a value indicating that the search result has not been received. Then, when the loop process is performed L times, the CPU 34 ends this flow (S75).

Figure 15:
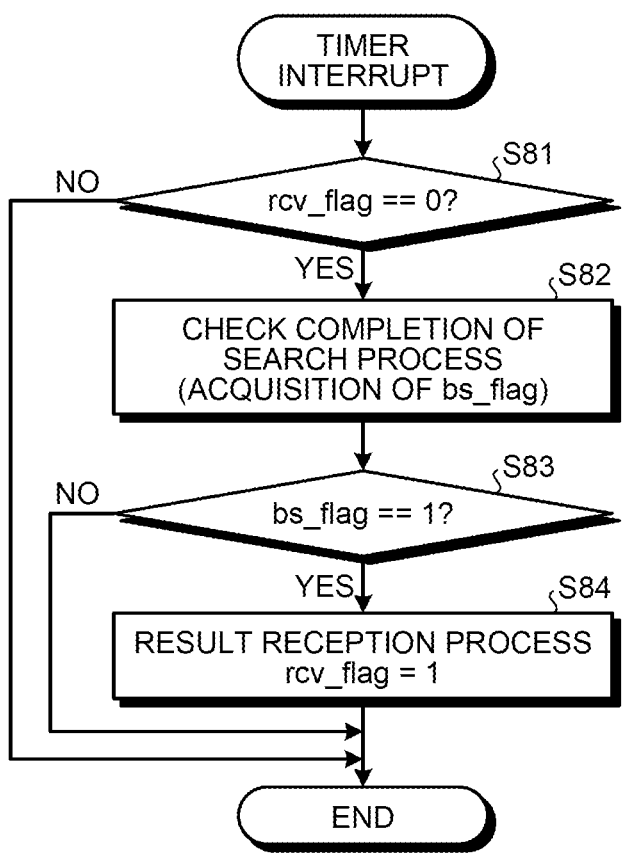
FIG. 15 is a flowchart of a timer interrupt of the third embodiment.

FIG. 15 is a flowchart illustrating a process flow when the timer interrupt occurs in the CPU 34 according to the third embodiment. The CPU 34 according to the third embodiment performs the process according to the flow illustrated in FIG. 15 when the timer interrupt occurs in a state where the timer interrupt is enabled.

First, at S81, the CPU 34 determines whether or not the second flag (rcv_flag) indicates that a search result has not been received. In a case where the second flag (rcv_flag) indicates that the search result has been received, that is, in a case where rcv_flag is not 0 (No at S81), the CPU 34 ends the flow of the timer interrupt. In a case where the second flag (rcv_flag) indicates that the search result has not been received, that is, in a case where rcv_flag is 0 (rcv_flag==0) (Yes at S81), the CPU 34 proceeds to S82.

At S82, the CPU 34 checks whether or not the search process performed by the FPGA 32 is completed. Specifically, the CPU 34 acquires the first flag (bs_flag).

Next, at S83, the CPU 34 determines whether or not the search process is completed. In a case where the search process is completed, that is, in a case where bs_flag is 1 (bs_flag==1) (Yes at S83), the CPU 34 proceeds to S84. In a case where the search process is not completed, that is, in a case where bs_flag is not 1 (No at S83), the CPU 34 ends the flow of the timer interrupt.

At S84, the CPU 34 receives a search result from the FPGA 32. Further, the CPU 34 sets the second flag (rcv_flag) to 1 which is a value indicating that the search result has been received, when the reception of the search result is completed. Then, when the process of S84 is completed, the CPU 34 ends the flow of the timer interrupt.

Figure 16:
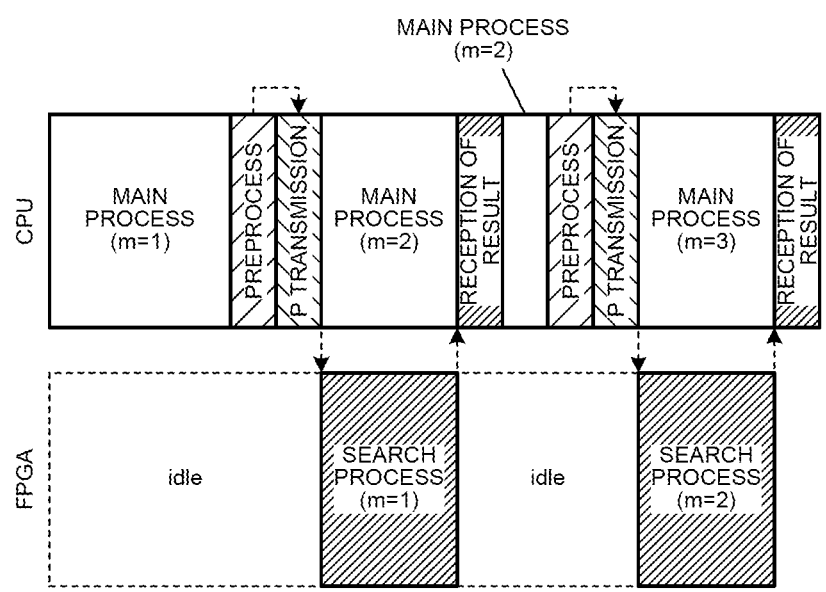
FIG. 16 is a timing chart of the third embodiment.

FIG. 16 is a timing chart of the process performed by the information processing system 10 according to the third embodiment. In the information processing system 10 according to the third embodiment, the CPU 34 performs the main process for the combinatorial optimization problem to be solved next during the search process performed by the FPGA 32. For example, in the information processing system 10, in a case where a first search process (m=1) for searching for the ground state of a first Ising model is performed, and then a second search process (m=2) for searching for the ground state of a second Ising model is performed, the CPU 34 and the FPGA 32 perform processes as follows.

First, the CPU 34 performs a first main process for generating information used for performing the first search process (m=1), and then performs a preprocess and a parameter transmission process for the first search process (m=1). Next, the FPGA 32 performs the first search process (m=1) after the first main process is performed by the CPU 34.

Next, the CPU 34 performs a second main process for generating information used for performing the second search process (m=2) during a period in which the FPGA 32 performs the first search process (m=1). In a case where the first search process (m=1) performed by the FPGA 32 is completed while the second main process is performed, the CPU 34 temporarily suspends the second main process and performs a result reception process for receiving a search result of the first search process (m=1). Then, the FPGA 32 performs the second search process (m=2) after the second main process is performed by the CPU 34.

As such, the information processing system 10 according to the third embodiment operates the CPU 34 and the FPGA 32 in parallel. As a result, the information processing system 10 according to the third embodiment can shorten the overall process time and increase the throughput as a whole.

Fourth Embodiment

Next, an information processing system 10 according to a fourth embodiment will be described. The configuration of the information processing system 10 according to the fourth embodiment is the same as the configuration of the information processing system 10 according to the third embodiment illustrated in FIG. 13. Further, a process of the information processing system 10 according to the fourth embodiment in a case where the timer interrupt occurs is different from that of the information processing system 10 according to the third embodiment, and other processes of the information processing system 10 according to the fourth embodiment are the same as those of the information processing system 10 according to the third embodiment. Therefore, in the description of the information processing system 10 according to the fourth embodiment, the same components as those of the third embodiment are designated by the same reference signs, and a detailed description thereof will be omitted.

The information processing system 10 according to the fourth embodiment sequentially solves a plurality of combinatorial optimization problems one by one, and in the information processing system 10 according to the fourth embodiment, the main process and the search process are performed by a CPU 34 and an FPGA 32, respectively, in parallel. Further, the information processing system 10 according to the fourth embodiment performs the search process multiple times if possible during the main process of the CPU 34.

Figure 17:
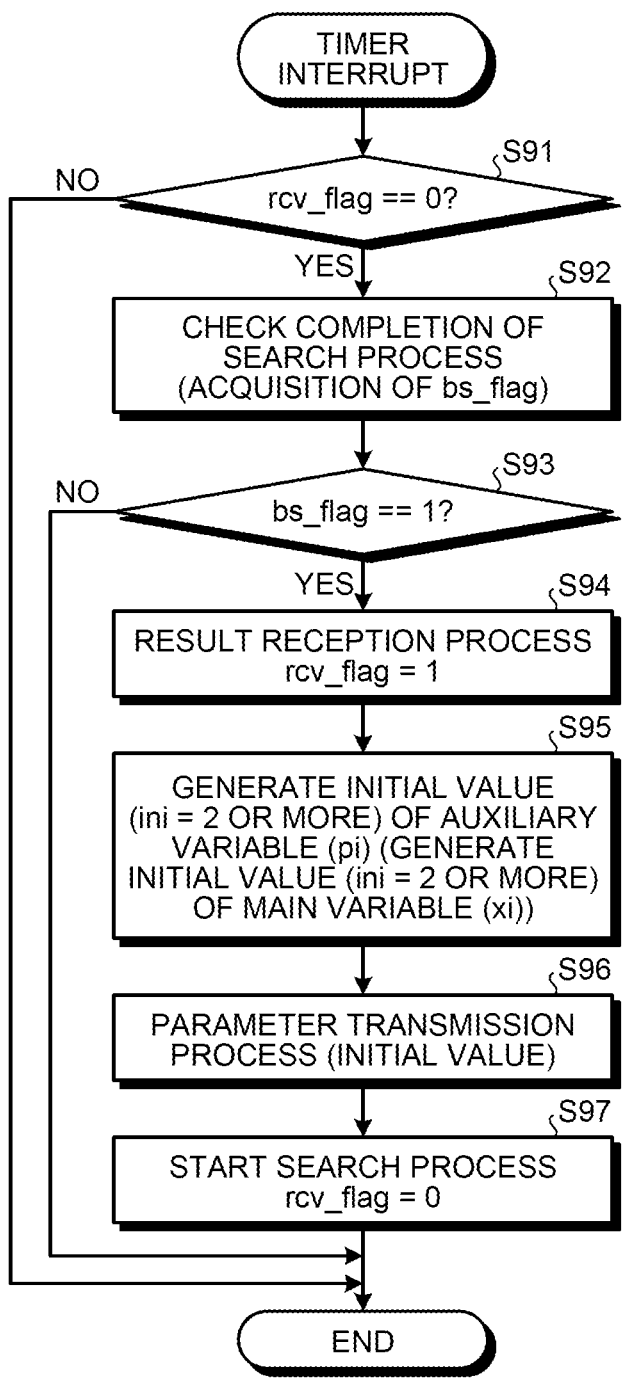
FIG. 17 is a flowchart of a timer interrupt of a fourth embodiment.

FIG. 17 is a flowchart illustrating a process flow when the timer interrupt occurs in the CPU 34 according to the fourth embodiment. The CPU 34 according to the fourth embodiment performs the process according to the flow illustrated in FIG. 17 when the timer interrupt occurs in a state where the timer interrupt is enabled.

First, at S91, the CPU 34 determines whether or not the second flag (rcv_flag) indicates that a search result has not been received. In a case where the second flag (rcv_flag) indicates that the search result has been received, that is, in a case where rcv_flag is not 0 (No at S91), the CPU 34 ends the flow of the timer interrupt. In a case where the second flag (rcv_flag) indicates that the search result has not been received, that is, in a case where rcv_flag is 0 (rcv_flag==0) (Yes at S91), the CPU 34 proceeds to S92.

At S92, the CPU 34 checks whether or not the search process performed by the FPGA 32 is completed. Specifically, the CPU 34 acquires the first flag (bs_flag).

Next, at S93, the CPU 34 determines whether or not the search process is completed. In a case where the search process is completed, that is, in a case where bs_flag is 1 (bs_flag==1) (Yes at S93), the CPU 34 proceeds to S94. In a case where the search process is not completed, that is, in a case where bs_flag is not 1 (No at S93), the CPU 34 ends the flow of the timer interrupt.

At S94, the CPU 34 receives a search result from the FPGA 32. Further, the CPU 34 sets the second flag (rcv_flag) to 1 which is a value indicating that the search result has been received, when the reception of the search result is completed.

Next, at S95, the CPU 34 generates the initial value of each of N auxiliary variables ($p_1$ to $p_N$). Note that the CPU 34 may further generate the initial value of each of N main variables ($x_1$ to $x_N$).

Here, in the present embodiment, the FPGA 32 can perform the search process multiple times while the main process is performed by the CPU 34 one time. At S95, the CPU 34 generates initial values for performing the second and subsequent search processes (ini=2 or more) out of a plurality of search processes performed while the main process is performed one time. At S95, the CPU 34 generates the initial value of each of N auxiliary variables ($p_1$ to $p_N$) and the initial value of each of N main variables ($x_1$ to $x_N$) so that different values are combined for each of the plurality of search processes performed during the main process.

Next, at S96, the CPU 34 transmits the generated initial value of each of N auxiliary variables ($p_1$ to $p_N$) to the FPGA 32. Further, when the CPU 34 generates the initial values of the main variables ($x_1$ to $x_N$), the CPU 34 transmits the generated initial value of each of N main variables ($x_1$ to $x_N$) to the FPGA 32.

Next, in S97, the CPU 34 instructs the FPGA 32 to start the search process. Further, the CPU 34 sets the second flag (rcv_flag) to 0 which is a value indicating that the search result has not been received.

When the FPGA 32 receives an instruction to start the search process from the CPU 34, the FPGA 32 changes only the initial value of each of N auxiliary variables ($p_1$ to $p_N$) and the initial value of each of N main variables ($x_1$ to $x_N$) without changing the definition information (J and h) and the control parameter, and starts the search process. Then, when the process of S97 is completed, the CPU 34 ends the flow of the timer interrupt.

Figure 18:
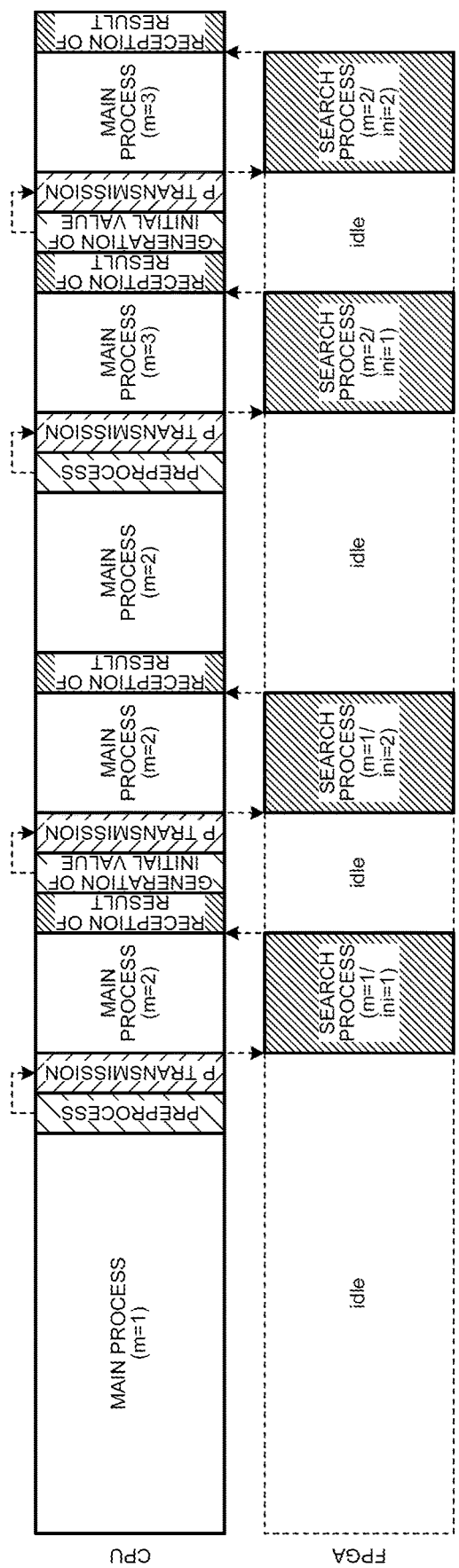
FIG. 18 is a timing chart of the fourth embodiment.

FIG. 18 is a timing chart of the process performed by the information processing system 10 according to the fourth embodiment.

In the information processing system 10 according to the fourth embodiment, the CPU 34 performs the main process for the combinatorial optimization problem to be solved next during the search process performed by the FPGA 32. Further, the FPGA 32 performs the search process multiple times while changing the initial value of each of N auxiliary variables ($p_1$ to $p_N$) until the CPU 34 ends the main process.

For example, in the information processing system 10, in a case where a first search process (m=1) for searching for the ground state of a first Ising model is performed, and then a second search process (m=2) for searching for the ground state of a second Ising model is performed, the CPU 34 and the FPGA 32 perform processes as follows.

First, the CPU 34 performs the first main process, and then performs the preprocess and the parameter transmission process for the first search process (m=1). Next, the FPGA 32 performs the first search process (m=1). Next, the CPU 34 performs the second main process during a period in which the FPGA 32 performs the first search process (m=1).

Here, in a case where the first search process (m=1) performed by the FPGA 32 is completed while the second main process is performed, the CPU 34 temporarily suspends the second main process and performs a result reception process for receiving a search result of the first search process (m=1). Further, the CPU 34 transmits a new initial value of each of N auxiliary variables ($p_1$ to $p_N$), and causes the FPGA 32 to perform the first search process again according to the new initial value. Then, the CPU 34 causes the FPGA 32 to repeat the first search process until the second main process is completed.

Then, in a case where a plurality of search results of the first search process obtained with different initial values of the auxiliary variable are received while the second main process is performed, the CPU 34 generates a search result of the first search process based on the plurality of received search results.

As described above, in the information processing system 10 according to the fourth embodiment, the CPU 34 and the FPGA 32 are operated in parallel, such that the overall process time can be shortened and the throughput can be increased as a whole. Further, the information processing system 10 according to the fourth embodiment can acquire a plurality of search results for one combinatorial optimization problem and output the solution based on the plurality of search results. As a result, the information processing system 10 according to the fourth embodiment can output a more accurate solution.

First Modified Example

Next, a first modified example will be described. The first modified example is applicable to all of the second to fourth embodiments.

The information processing system 10 according to the first modified example solves a plurality of combinatorial optimization problems one by one. Before solving each combinatorial optimization problem, the information processing system 10 determines whether or not a circuit currently configured in the FPGA 32 is suitable, and in a case where the circuit is not suitable, the information processing system 10 reconfigures the FPGA 32, and in a case where the circuit is suitable, the information processing system 10 performs the process without reconfiguring the FPGA 32.

For example, the CPU 34 selects circuit information indicating a circuit that performs an appropriate algorithm according to a combinatorial optimization problem to be solved or a purpose (putting emphasis on the convergence speed, accuracy, or the like) among a plurality of circuit informations, and reconfigures the FPGA 32 according to the selected circuit information. Further, for example, the CPU 34 determines whether or not to reconfigure the FPGA 32 to shorten the entire process time including the reconfiguration time.

Figure 19:
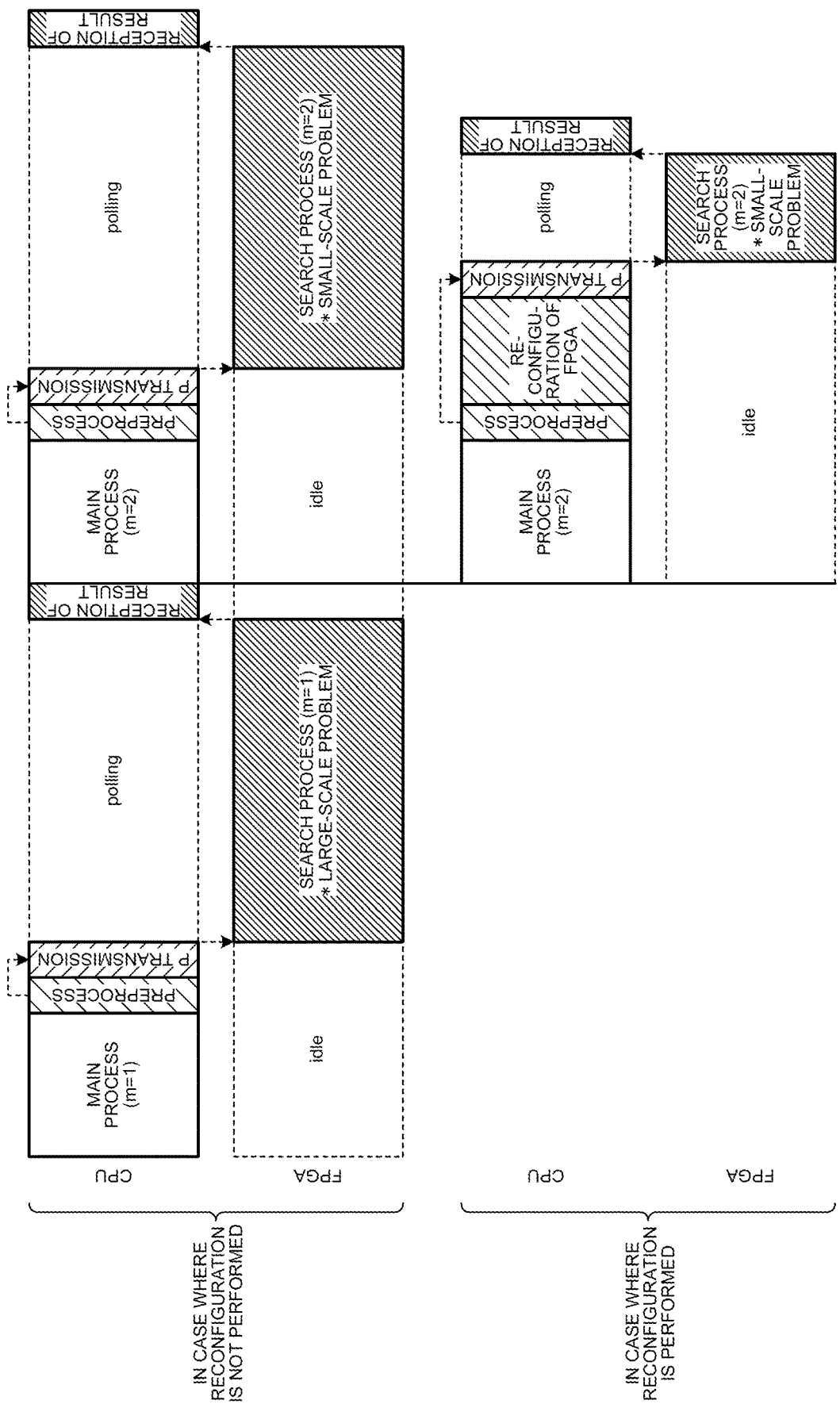
FIG. 19 is a diagram illustrating process times in a case of not performing reconfiguration and in a case of performing reconfiguration.

FIG. 19 is a diagram illustrating a process time in a case where the FPGA 32 is not reconfigured and a process time in a case where the FPGA 32 is reconfigured. For example, it is assumed that the information processing system 10 executes an application that solves a combinatorial optimization problem in which the size of the J matrix changes dynamically.

It is assumed that the application solves a large-scale problem (N=$N_{large}$) in the first process (m=1), and then solves a small-scale problem (N=$N_{small}$) in the second process (m=2). Note that $N_{large}$>$N_{small}$. In a case where the reconfiguration is not performed in the second process (m=2), the FPGA 32 performs the search process for the ground state by using a circuit for solving the large-scale problem (N=$N_{large}$). Therefore, in a case where the reconfiguration is not performed in the second process (m=2), the process time is determined by a variable update time for updating $N_{large}$ main variables and $N_{large}$ auxiliary variables, and the number of repetitions of an update process.

In the second process (m=2), the search process in a specified state can be performed by a circuit for solving the small-scale problem (N=$N_{small}$). A variable update time of the circuit for solving the small-scale problem (N=$N_{small}$) is shorter than a variable update time of the circuit for solving the large-scale problem (N=$N_{large}$). However, the FPGA 32 needs to perform the reconfiguration process in a case of implementing the circuit for solving the small-scale problem (N=$N_{small}$) in the second process (m=2). That is, in a case where the sum of the process time of the circuit after the reconfiguration and the reconfiguration time is shorter than the previous process time of the circuit before the reconfiguration, the FPGA 32 can shorten the overall process time of the second process (m=2).

Therefore, in a case of performing a search process for searching for the ground state of the second Ising model that can be searched for by a first circuit capable of searching for the ground state of the first Ising model in a state where the first circuit is configured in the FPGA 32, the CPU 34 performs the following processes.

First, a first time representing an estimated execution time of the search process performed by the first circuit and a second time including a reconfiguration time for reconfiguring the FPGA 32 as the second circuit and an estimated execution time of the search process performed by the second circuit are compared with each other. Here, the second circuit is a circuit that can search for the ground state of the second Ising model, and of which the search time is shorter than that of the first circuit.

Then, in a case where the second time is equal to or longer than the first time, the CPU 34 causes the FPGA 32 to perform the search process for searching for the ground state of the second Ising model without reconfiguring the FPGA 32 in which the first circuit is configured. In a case where the second time is shorter than the first time, the CPU 34 reconfigures the FPGA 32 as the second circuit and causes the FPGA 32 to perform the search process for searching for the ground state of the second Ising model. By performing such a process, the information processing system 10 can shorten the overall process time.

In addition, the information processing system 10 may continuously search for the ground state of one or more Ising models that can search for the ground state by using the second circuit after searching for the ground state of the second Ising model. In such a case, the CPU 34 adds, to the first time, a predicted execution time in a case where the first circuit searches for the ground state of each of one or more Ising models following the second Ising model. Further, the CPU 34 adds, to the second time, a predicted execution time in a case where the second circuit searches for the ground state of each of one or more Ising models following the second Ising model. As a result, the information processing system 10 can shorten the overall process time even in a case where the second circuit continuously searches for the ground states of a plurality of Ising models.

Second Modified Example

Next, a second modified example will be described. The second modified example is applicable to all of the first to fourth embodiments.

FIG. 20 is a diagram illustrating coupling information including a coupling coefficient. In the second modified example, the information processing system 10 acquires, from the user or the like, definition information that defines the Ising model representing the combinatorial optimization problem to be solved. The definition information includes the coupling information in which a plurality of coupling coefficients that define the Ising model are described. For example, the information processing system 10 acquires filed coupling information described in a predetermined format.

Each of the plurality of coupling coefficients included in the coupling information is associated with an index for specifying the i-th and an index for specifying the j-th. Further, for example, in the coupling information, a plurality of coupling coefficients are described side by side in raster scan order of the indexes of i and j. Therefore, the CPU 34 can detect the size of the J matrix from the indexes (i and j) of the coupling coefficient at the final position. For example, in the example of FIG. 20, the CPU 34 detects N=4 as the size of the Ising model by detecting N≥max (i,j). Note that max ( ) is a function that detects the maximum values of i and j among a plurality of coupling coefficients included in the coupling information.

Prior to the search process for the combinatorial optimization problem, the CPU 34 selects appropriate circuit information from a plurality of circuit informations stored in the circuit information storage device 38, and provides the selected circuit information to the FPGA 32 to configure a circuit in the FPGA 32. In this case, the CPU 34 selects the circuit information based on the size of the Ising model detected from coefficient information. For example, the CPU 34 selects circuit information indicating a circuit that searches for an Ising model which has the smallest size larger than the size detected from the coefficient information.

Further, the CPU 34 may select a circuit indicated by the circuit information selected based on the coupling information as the second circuit in the first modified example.

Further, in a case where a plurality of circuit informations indicating circuits having different coupling coefficient accuracy are included, the circuit information storage device 38 may select, based on the accuracy of the coupling coefficient described in the coupling information, one circuit information indicating a circuit capable of searching for the ground state of the Ising model.

For example, the CPU 34 selects circuit information indicating a circuit that performs calculation with an integer type 16-bit precision in a case where all of the plurality of coupling coefficients described in the coupling information are represented by integers and are in a range of −32768 to 32767. Further, in a case where any one of a plurality of coupling coefficients described in the coupling information is a decimal coupling coefficient, the CPU 34 selects circuit information indicating a circuit that performs calculation with a floating-point type or fixed-point type precision.

Further, the CPU 34 may cause the display device 42 to display the selected circuit information, the detected size of the Ising model, and the accuracy of the coupling coefficient. As a result, the CPU 34 can notify the user of these information.

As such, the information processing system 10 according to the second modified example detects the size of the Ising model and the accuracy of the coupling coefficient included in the J matrix from the coupling information in which the coupling coefficient is described, and selects, based on the detected size and accuracy, appropriate circuit information among a plurality of circuit informations to configure a circuit in the FPGA 32. As a result, the information processing system 10 according to the second modified example can save the user the trouble of specifying the circuit information and eliminate the risk of specifying incorrect information. Note that a method for detecting the format of the filed coupling information and the size, and a method for detecting the accuracy of the coupling coefficient are not limited to the above methods, and may be any method.

Third Modified Example

Next, a third modified example will be described. The third modified example is applicable to all of the first to fourth embodiments.

In the third modified example, the circuit information storage device 38 stores a plurality of circuit informations for implementing circuits that perform the search process by using algorithms different from each other. In the third modified example, the user inputs other information except for information for specifying the algorithm. For example, the user inputs the definition information (J matrix and h vector) and the control parameter.

In the third modified example, the CPU 34 selects two or more circuit information with different algorithms for calculating the main variable ($x_i$) and the auxiliary variable ($p_i$) in the main variable update process and the auxiliary variable update process among a plurality of circuit informations. Then, the CPU 34 sequentially reconfigures the FPGA 32 according to each of the two or more selected circuit information, causes the FPGA 32 to perform the search process, and receives a search result. In this case, the FPGA 32 acquires the search result with the same definition information, the same control parameter, the same initial value of the main variable ($x_i$), and the same initial values of the plurality of auxiliary variables ($p_i$) for each of the two or more circuit information. Then, the CPU 34 outputs the search result to the user by displaying a pair of information for identifying the algorithm and the search result on the display device 42 for each of the two or more circuit information.

As the Ising machine 12 changes the algorithm, performance indicators such as a convergence speed and resulting solution accuracy may change. The information processing system 10 according to the third modified example can perform the search process by using a plurality of algorithms and output a search result for each of the plurality of algorithms to notify the user of an algorithm by which an appropriate search result can be easily obtained.

Fourth Modified Example

Next, a fourth modified example will be described. The fourth modified example is applicable to all of the first to fourth embodiments.

As illustrated in FIG. 4, the FPGA 32 (Ising machine 12) alternately repeats the auxiliary variable update process (S115) for updating the auxiliary variable ($y_i$) and the main variable update process (S118) for updating the main variable ($x_i$) a predetermined number of times. In the fourth modified example, the information processing system 10 further includes an update history storage device that stores the update history of N main variables ($x_i$) and the update history of N auxiliary variables ($y_i$) for each repetition in FIG. 4. For example, the FPGA 32 (Ising machine 12) stores, in the memory, the number of repetitions, the values of N main variables ($x_i$), and the values of N auxiliary variables ($y_i$) in association with one another during the update process, and outputs them to the update history storage device after the search process is completed. When an instruction is received from the user, the CPU 34 (host unit 14) receives the update history of the values of N main variables ($x_i$) and the update history of the values of N auxiliary variables ($y_i$) stored in the update history storage device, and causes the display device 42 to display the received update history in a form of, for example, a graph.

As a result, the information processing system 10 according to the fourth modified example can allow the user to refer to the update history of the values of N main variables ($x_i$) and the update history of the values of N auxiliary variables ($y_i$) for a study of the combinatorial optimization problem or the like.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. An information processing system that solves a combinatorial optimization problem, the information processing system comprising:
   an Ising machine which is hardware configured to perform a search process for searching for a ground state of an Ising model that represents the combinatorial optimization problem; and
   a host unit which is hardware that is connected to the Ising machine via an interface, the host unit being configured to control the Ising machine,
   in the search process, the Ising machine being configured to:
      store a main variable and an auxiliary variable that correspond to each of a plurality of Ising spins included in the Ising model in association with each other;
      alternately repeat an auxiliary variable update process for updating the auxiliary variable by the main variable and a main variable update process for updating the main variable by the auxiliary variable multiple times for each of the plurality of Ising spins; and
      output, as a search result, a value based on the main variable corresponding to each of the plurality of Ising spins after alternately repeating the main variable update process and the auxiliary variable update process multiple times, and
   the host unit being configured to:
      prior to the search process, transmit, to the Ising machine, an initial value of the auxiliary variable corresponding to each of the plurality of Ising spins; and
      after the search process, receive the search result from the Ising machine, and output a solution of the combinatorial optimization problem based on the received search result.

2. The system according to claim 1, wherein
prior to the search process, the Ising machine sets an initial value of the main variable corresponding to each of the plurality of Ising spins to a predetermined value.

3. The system according to claim 1, wherein
prior to the search process, the host unit transmits, to the Ising machine, an initial value of the main variable corresponding to each of the plurality of Ising spins.

4. The system according to claim 1, wherein
prior to the search process, the host unit transmits, to the Ising machine, definition information for defining the Ising model and a control parameter for controlling the search process.

5. The system according to claim 1, further comprising:
a first flag storage circuit configured to store a first flag indicating whether or not the search process is completed, wherein
the first flag storage circuit updates a value of the first flag in response to a notification transmitted from the Ising machine when the search process is completed, and
the host unit receives the search result from the Ising machine according to the value of the first flag.

6. The system according to claim 1, wherein
when a first search process for searching for a ground state of a first Ising model is performed and then a second search process for searching for a ground state of a second Ising model is performed, the host unit performs a first main process for generating information used for performing the first search process, the Ising machine performs the first search process after the first main process is performed by the host unit, the host unit performs a second main process for generating information used for performing the second search process during a period in which the Ising machine is performing the first search process, and the Ising machine performs the second search process after the second main process is performed by the host unit.

7. The system according to claim 6, wherein when the first search process is completed while the second main process is being performed, the host unit transmits a new initial value of the auxiliary variable and causes the Ising machine to again perform the first search process according to the new initial value of the auxiliary variable, and when a plurality of search results of the first search process with different initial values of the auxiliary variable are received while the second main process is being performed, the host unit generates the search result of the first search process based on the plurality of received search results.

8. The system according to claim 1, wherein the Ising machine includes a reconfigurable semiconductor device, the information processing system further comprises a circuit information storage device configured to store a plurality of circuit informations each indicating a circuit that causes the semiconductor device to implement the search process, and prior to the search process, the host unit selects one circuit information indicating a circuit configured to search for the ground state of the Ising model among the plurality of circuit informations, and reconfigures the Ising machine according to the selected circuit information.

9. The system according to claim 8, wherein when performing the search process for searching for a ground state of a second Ising model that is searchable by a first circuit configured to search for a ground state of a first Ising model in a state where the first circuit is configured in the semiconductor device, the host unit:

compares a first time representing an estimated execution time of the search process performed by the first circuit with a second time including a reconfiguration time for reconfiguring the semiconductor device as a second circuit and an estimated execution time of the search process performed by the second circuit; and when the second time is shorter than the first time, reconfigures the semiconductor device as the second circuit and causes the Ising machine to perform the search process, and the second circuit includes a circuit that is configured to search for the ground state of the second Ising model and of which a search time is shorter than that of the first circuit.

10. The system according to claim 8, wherein the host unit:

acquires coefficient information including a plurality of coupling coefficients that define the Ising model; and selects, based on a number of the plurality of coupling coefficients included in the coefficient information, one circuit information indicating a circuit configured to search for the ground state of the Ising model among the plurality of circuit informations.

11. The system according to claim 8, wherein the host unit:

acquires coefficient information including a coupling coefficient that defines the Ising model; and selects, based on accuracy of the coupling coefficient included in the coefficient information, one circuit information indicating a circuit configured to search for the ground state of the Ising model among the plurality of circuit informations.

12. The system according to claim 8, wherein when being instructed to search for the ground state of the Ising model, the host unit:

selects two or more circuit informations with different algorithms for calculating the main variable and the auxiliary variable in the main variable update process and the auxiliary variable update process from among the plurality of circuit informations, sequentially reconfigures the semiconductor device according to each of the two or more circuit informations, causes the Ising machine to perform the search process, and receives the search result; and outputs the search result received based on the two or more circuit informations.

13. The system according to claim 1, wherein the Ising machine stores a value of the main variable corresponding to each of the plurality of Ising spins in association with a number of repetitions of the main variable update process each time the main variable update process is performed, and after the search process, the host unit receives the value of the main variable corresponding to each of the plurality of Ising spins, the value being associated with the number of repetitions of the main variable update process.

* * * * *